US012787218B2

(12) United States Patent
Kuo et al.

(10) Patent No.: US 12,787,218 B2
(45) Date of Patent: Nov. 3, 2026

(54) SYSTEM AND METHOD FOR ALL-IN-ONE LIQUID COOLING MODULE WITH INTEGRATED SCREW PUMPS

(71) Applicant: Dell Products, LP, Round Rock, TX (US)

(72) Inventors: Yu-Ming Kuo, New Taipei City (TW); Yen-Ming Chen, New Taipei City (TW); Kai-Po Chang, Taiwan (TW)

(73) Assignee: DELL PRODUCTS LP, Round Rock, TX (US)

( * ) Notice: Subject to any disclaimer, the term of this patent is extended or adjusted under 35 U.S.C. 154(b) by 197 days.

(21) Appl. No.: 18/525,608

(22) Filed: Nov. 30, 2023

(65) Prior Publication Data

US 2025/0185204 A1 Jun. 5, 2025

(51) Int. Cl.
*H05K 7/20* (2006.01)

(52) U.S. Cl.
CPC ..... *H05K 7/20272* (2013.01); *H05K 7/20136* (2013.01); *H05K 7/202* (2013.01)

(58) Field of Classification Search
CPC ........... H05K 7/20272; H05K 7/20136; H05K 7/202; H05K 7/20327; F04D 3/02
See application file for complete search history.

(56) References Cited

U.S. PATENT DOCUMENTS

| | | | | |
|---|---|---|---|---|
| 6,208,512 | B1 * | 3/2001 | Goldowsky | F16C 33/107 361/679.48 |
| 7,352,577 | B2 * | 4/2008 | Chen | F28D 7/026 361/698 |
| 8,120,916 | B2 | 2/2012 | Schmidt | |
| 2008/0006389 | A1 | 1/2008 | Sauciuc | |
| 2008/0226481 | A1 * | 9/2008 | Schofield | F04C 25/02 418/201.1 |
| 2020/0052356 | A1 | 2/2020 | Eadelson | |
| 2021/0204451 | A1 | 7/2021 | Keehn | |
| 2023/0015461 | A1 | 1/2023 | Keehn | |
| 2023/0194177 | A1 * | 6/2023 | Huang | F28F 9/0209 165/67 |
| 2023/0301028 | A1 * | 9/2023 | Yin | H05K 7/20409 361/696 |
| 2024/0318926 | A1 * | 9/2024 | Huang | F28D 1/05391 |
| 2024/0389233 | A1 * | 11/2024 | Tse | G01K 1/14 |

* cited by examiner

*Primary Examiner* — Jayprakash N Gandhi
*Assistant Examiner* — Matthew Sinclair Muir
(74) *Attorney, Agent, or Firm* — Prol Intellectual Property Law, PLLC; H. Kenneth Prol

(57) ABSTRACT

An information a hardware processor, a memory device, and a power management unit to provide power to the hardware processor and memory device. The information handling system further includes a liquid cooling module comprising a coolant loop tube core, an integrated screw pump formed through the coolant loop tube core, a first manifold including a screw pump drive system to drive the integrated screw pump, and a second manifold, wherein the first manifold, cylindrical cooling loop core, and second manifold hold a coolant therein for the screw pump to pump the coolant from the first manifold and to the second manifold through the coolant loop tube core. The liquid cooling module is thermally coupled to one or more heat-producing components of the information handling system.

20 Claims, 13 Drawing Sheets

SYSTEM AND METHOD FOR ALL-IN-ONE LIQUID COOLING MODULE WITH INTEGRATED SCREW PUMPS

FIELD OF THE DISCLOSURE

The present disclosure generally relates to a cooling system for an information handling system. The present disclosure more specifically relates to a liquid cooling system of an information handling system using at least one screw pump integrated into a heat exchanger and set of stacked fins.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. The information handling system may be used to execute instructions of one or more applications such as a gaming application. Further, the information handling system may include cooling system used to cool those heat-producing component devices such as a central processing unit (CPU), a hardware processor, a graphical processing unit (GPU), power source, and the like for thermal control of the information handling system.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
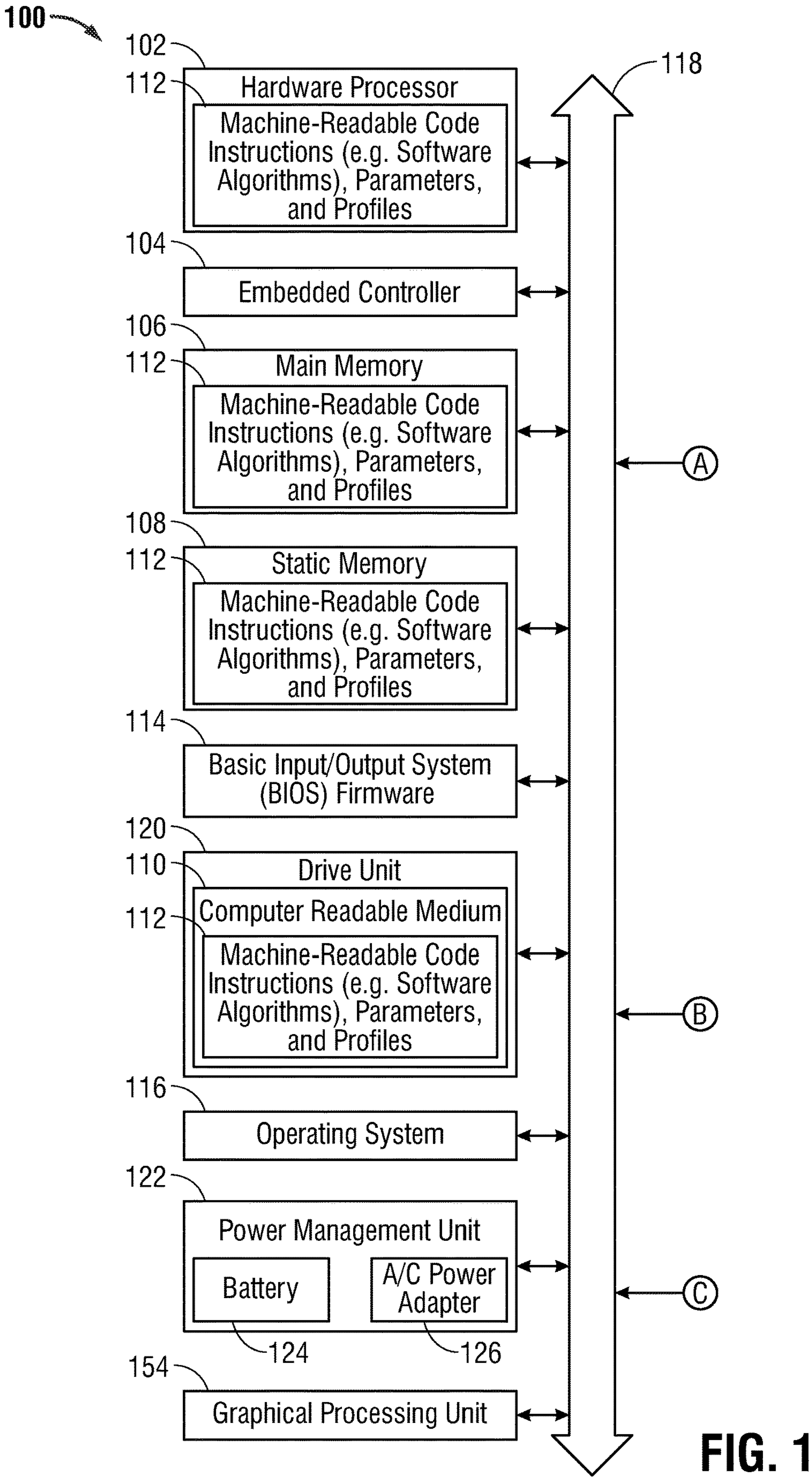
FIG. 1 is a block diagram illustrating an information handling system with a liquid cooling module according to an embodiment of the present disclosure.
Figure 1:
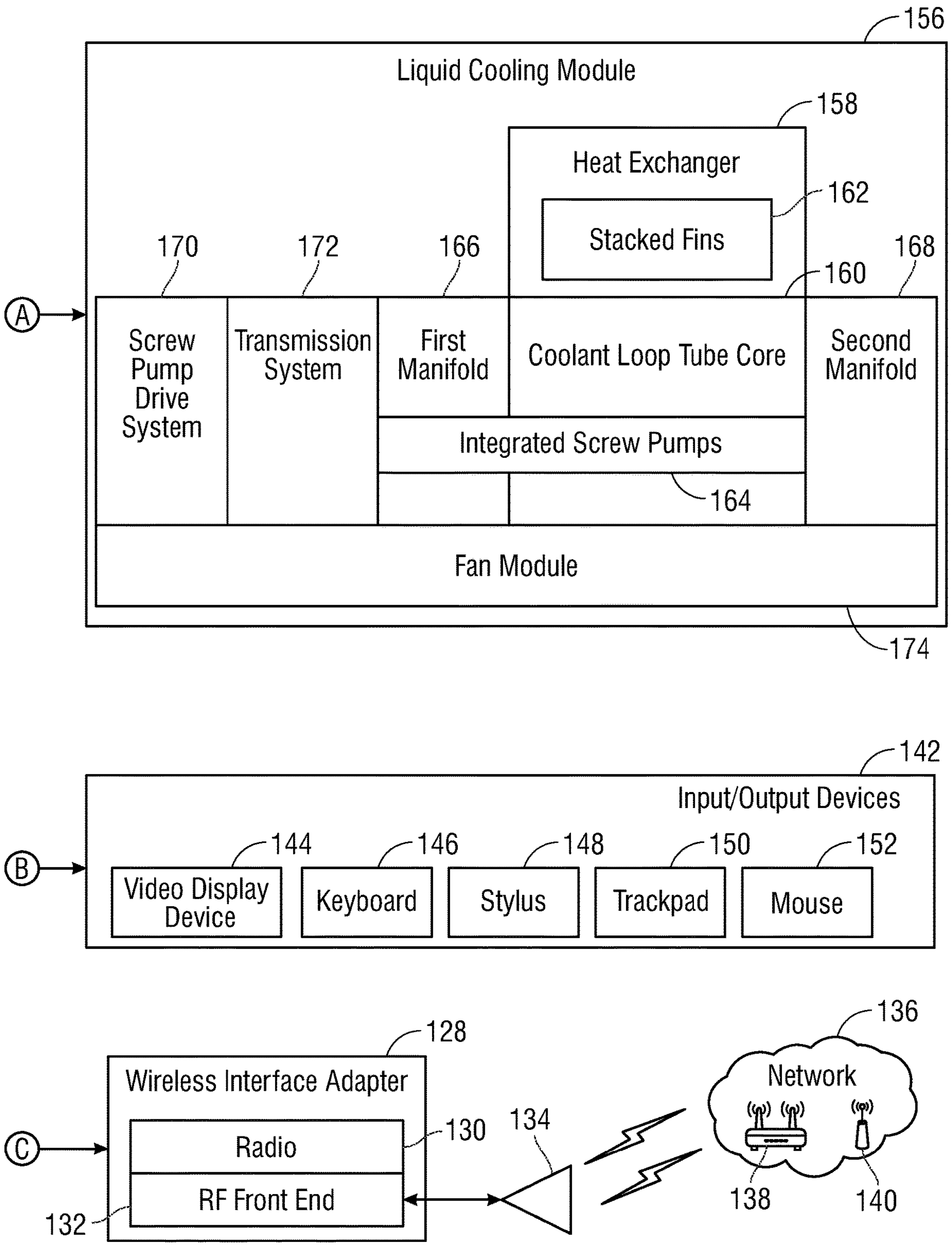

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Information handling systems include a number of heat-producing component devices. These heat-producing component devices may include hardware processing component devices such as a central processing unit (CPU) and a graphical processing unit (GPU) among other component devices. The CPU in particular may cause extreme thermal performance as faster CPU operations are required. These extreme thermal performances may, at times, exceed the operational temperature of the CPU or other head-generating device without a cooling system such as a liquid cooling system. Liquid cooling systems may include a cold plate formed on a heat-producing component (e.g., CPU, GPU, battery, power adapter, etc.) that includes a coolant via formed therethrough such that coolant may be passed. A heat exchanger may also be fluidically coupled to the coolant via such that the coolant may be passed from the heated cold plate to the heat exchanger so that heat from the heated coolant may be dissipated at the heat exchanger. Existing liquid cooling systems continue to be improved using enlarged radiator sizes, increased airflow rates, or increased coolant flow rates in order to meet the cooling needs of a heat-producing component such as a CPU. According to the heat exchanger theory, thermal performance of a liquid cooling system should consider both heat transfer rates of a cooling fluid (e.g., coolant) as well as heat transfer rates of airflow across or through a radiator. Current liquid cooling systems, however, may only fulfill a 360 mm heat exchange below about 100 cubic feet per minute (CFM). By, for example, doubling the airflow rate, a 9% increase in heat dissipation is realized. Additionally, empirical data shows that increasing the liquid flow rate by 17% shows a 12% increase in heat dissipation. However, with current liquid cooling systems, head or fluidic pressure drop have constraints due to a cold plate design.

The present specification describes an information handling system that includes a hardware processor, a memory device, and a power management unit (PMU) to provide power to the hardware processor and memory device. The information handling system further includes a liquid cooling module. The liquid cooling module includes a coolant loop tube core and an integrated screw pump formed through the coolant loop tube core. The liquid cooling module further includes a first manifold including a screw pump drive system to drive the integrated screw pump and a second manifold. In an embodiment, the first manifold, cylindrical cooling loop core, and second manifold hold coolant therein for the screw pump to pump the coolant from the first manifold and to the second manifold.

In an embodiment, the liquid cooling module further includes a heat exchanger comprising stacked fin layers wherein the cylindrical coolant loop is formed through vias formed through the stacked fin layers. In an embodiment, a plurality of coolant loop tube cores may be formed in the liquid cooling module and a plurality of integrated screw pumps each may be formed through one of the plurality of coolant loop tube cores. A transmission system of the screw pump drive system may be operatively coupled to the integrated screw pumps to concurrently drive each of the plurality of integrated screw pumps formed through each one of the plurality of coolant loop tube cores. The coolant loop tube cores may be cylindrical, oval, squared, rectangular, or another cross-section shape in various embodiments herein.

Turning now to the figures, FIG. 1 illustrates an information handling system 100 similar to the information handling systems according to several aspects of the present disclosure. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP) 138, a base station transceiver 140, a wireless telephone, a control system, a camera, a scanner, a printer, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a server or as a client computer in a server-client network environment, or as a peer computer system in a peer-to-peer (or distributed) network environment. In an embodiment, the information handling system 100 may be implemented using electronic devices that provide voice, video, or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or plural sets, of instructions to perform one or more computer functions.

The information handling system 100 may include main memory 106, (volatile (e.g., random-access memory, etc.), or static memory 108, nonvolatile (read-only memory, flash memory etc.) or any combination thereof), one or more hardware processing resources, such as a hardware processor 102 that may be a central processing unit (CPU), a graphics processing unit (GPU) 103, embedded controller (EC) 104, or any combination thereof. Additional components of the information handling system 100 may include one or more storage devices such as static memory 108 or drive unit 120. The information handling system 100 may include or interface with one or more communications ports for communicating with external devices, as well as various input and output (I/O) devices 142, such as a mouse 152, a trackpad 150, a keyboard 146, a stylus 148, a video/graphics display device 144, or any combination thereof. Portions of an information handling system 100 may themselves be considered information handling systems 100.

Information handling system 100 may include devices or modules that embody one or more of the devices or execute instructions for one or more systems and modules. The information handling system 100 may execute instructions (e.g., software algorithms), parameters, and profiles 112 that may operate on servers or systems, remote data centers, or on-box in individual client information handling systems according to various embodiments herein. In some embodiments, it is understood any or all portions of instructions (e.g., software algorithms), parameters, and profiles 112 may operate on a plurality of information handling systems 100.

The information handling system 100 may include the hardware processor 102 such as a central processing unit (CPU). Any of the processing resources may operate to execute code that is either firmware or software code. Moreover, the information handling system 100 may include memory such as main memory 106, static memory 108, and disk drive unit 120 (volatile (e.g., random-access memory, etc.), nonvolatile memory (read-only memory, flash memory etc.) or any combination thereof or other memory with computer readable medium 110 storing instructions (e.g., software algorithms), parameters, and profiles 112 executable by the EC 104, hardware processor 102, GPU 103, or any other processing device. The information handling system 100 may also include one or more buses 118 operable to transmit communications between the various hardware components such as any combination of various I/O devices 142 as well as between hardware processors 102, an EC 104, the operating system (OS) 116, the basic input/output system (BIOS) 114, the wireless interface adapter 128, or a radio module, among other components described herein. In an embodiment, the information handling system 100 may be in wired or wireless communication with the I/O devices 142 such as a keyboard 146, a mouse 152, video display device 144, stylus 148, or trackpad 150 among other peripheral devices.

The information handling system 100 further includes a video/graphics display device 144. The video/graphics display device 144 in an embodiment may function as a liquid crystal display (LCD), an organic light emitting diode (OLED), a flat panel display, or a solid-state display. Additionally, as described herein, the information handling system 100 may include one or more other I/O devices 142 including the wired or wireless mouse 152 described herein that allows the user to interface with the information handling system 100 via the video/graphics display device 144, a cursor control device (e.g., a trackpad 150, or gesture or touch screen input), a stylus 148, and/or a keyboard 146, among others. Various drivers and control electronics may be operatively coupled to operate the I/O devices 142 according to the embodiments described herein. The present specification contemplates that the I/O devices 142 may be wired or wireless.

A network interface device of the information handling system 100 shown as wireless interface adapter 128 can provide connectivity among devices such as with Bluetooth® or to a network 136, e.g., a wide area network (WAN), a local area network (LAN), wireless local area network (WLAN), a wireless personal area network (WPAN), a wireless wide area network (WWAN), or other network. In embodiments described herein, the wireless interface device 128 with its radio 130, RF front end 132 and antenna 134 is used to communicate with the wireless peripheral devices via, for example, a Bluetooth® or Bluetooth® Low Energy (BLE) protocols. In an embodiment, the WAN, WWAN, LAN, and WLAN may each include an AP 138 or base station 140 used to operatively couple the information handling system 100 to a network 136. In a specific embodiment, the network 136 may include macro-cellular connections via one or more base stations 140 or a wireless AP 138 (e.g., Wi-Fi), or such as through licensed or unlicensed WWAN small cell base stations 140. Connectivity may be via wired or wireless connection. For example, wireless network wireless APs 138 or base stations 140 may be operatively connected to the information handling system 100. Wireless interface adapter 128 may include one or more radio frequency (RF) subsystems (e.g., radio 130) with transmitter/receiver circuitry, modem circuitry, one or more antenna radio frequency (RF) front end circuits 132, one or more wireless controller circuits, amplifiers, antennas 134 and other circuitry of the radio 130 such as one or more antenna ports used for wireless communications via multiple radio access technologies (RATs). The radio 130 may communicate with one or more wireless technology protocols.

In an embodiment, the wireless interface adapter 128 may operate in accordance with any wireless data communication standards. To communicate with a wireless local area network, standards including IEEE 802.11 WLAN standards (e.g., IEEE 802.11ax-2021 (Wi-Fi 6E, 6 GHz)), IEEE 802.15 WPAN standards, WWAN such as 3GPP or 3GPP2, Bluetooth® standards, or similar wireless standards may be used. Wireless interface adapter 128 may connect to any combination of macro-cellular wireless connections including 2G, 2.5G, 3G, 4G, 5G or the like from one or more service providers. Utilization of radio frequency communication bands according to several example embodiments of the present disclosure may include bands used with the WLAN standards and WWAN carriers which may operate in both licensed and unlicensed spectrums. The wireless interface adapter 128 can represent an add-in card, wireless network interface module that is integrated with a main board of the information handling system 100 or integrated with another wireless network interface capability, or any combination thereof.

In some embodiments, software, firmware, dedicated hardware implementations such as application specific integrated circuits, programmable logic arrays and other hardware devices may be constructed to implement one or more of some systems and methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations may include distributed processing, component/object distributed processing, and parallel processing. Alternatively, virtual computer system processing may be constructed to implement one or more of the methods or functionalities as described herein.

The present disclosure contemplates a computer-readable medium that includes instructions, parameters, and profiles 112 or receives and executes instructions, parameters, and profiles 112 responsive to a propagated signal, so that a device connected to a network 136 may communicate voice, video, or data over the network 136. Further, the instructions 112 may be transmitted or received over the network 136 via the network interface device or wireless interface adapter 128.

The information handling system 100 may include a set of instructions 112 that may be executed to cause the computer system to perform any one or more of the methods or computer-based functions disclosed herein. For example, instructions 112 may be executed by a hardware processor 102, GPU 103, EC 104 or any other hardware processing resource and may include software agents, or other aspects or components used to execute the methods and systems described herein. Various software modules comprising application instructions 112 may be coordinated by an OS 116, and/or via an application programming interface (API). An example OS 116 may include Windows®, Android®, and other OS types. Example APIs may include Win 32, Core Java API, or Android APIs.

In an embodiment, the information handling system 100 may include a disk drive unit 120. The disk drive unit 120 and may include machine-readable code instructions, parameters, and profiles 112 in which one or more sets of machine-readable code instructions, parameters, and profiles 112 such as firmware or software can be embedded to be executed by the hardware processor 102 or other hardware processing devices such as a GPU 103 or EC 104, or other microcontroller unit to perform the processes described herein. Similarly, main memory 106 and static memory 108 may also contain a computer-readable medium for storage of one or more sets of machine-readable code instructions, parameters, or profiles 112 described herein. The disk drive unit 120 or static memory 108 also contain space for data storage. Further, the machine-readable code instructions, parameters, and profiles 112 may embody one or more of the methods as described herein. In a particular embodiment, the machine-readable code instructions, parameters, and profiles 112 may reside completely, or at least partially, within the main memory 106, the static memory 108, and/or within the disk drive 120 during execution by the hardware processor 102, EC 104, or GPU 103 of information handling system 100.

Main memory 106 or other memory of the embodiments described herein may contain computer-readable medium (not shown), such as RAM in an example embodiment. An example of main memory 106 includes random access memory (RAM) such as static RAM (SRAM), dynamic RAM (DRAM), non-volatile RAM (NV-RAM), or the like, read only memory (ROM), another type of memory, or a combination thereof. Static memory 108 may contain computer-readable medium (not shown), such as NOR or NAND flash memory in some example embodiments. The applications and associated APIs, for example, may be stored in static memory 108 or on the disk drive unit 120 that may include access to a machine-readable code instructions, parameters, and profiles 112 such as a magnetic disk or flash memory in an example embodiment. While the computer-readable medium is shown to be a single medium, the term "computer-readable medium" includes a single medium or multiple media, such as a centralized or distributed database, and/or associated caches and servers that store one or more sets of machine-readable code instructions. The term "computer-readable medium" shall also include any medium that is capable of storing, encoding, or carrying a set of machine-readable code instructions for execution by a processor or that cause a computer system to perform any one or more of the methods or operations disclosed herein.

In an embodiment, the information handling system 100 may further include a power management unit (PMU) 122 (a.k.a. a power supply unit (PSU)). The PMU 122 may include a hardware controller and executable machine-readable code instructions to manage the power provided to the components of the information handling system 100 such as the hardware processor 102 and other hardware components described herein. The PMU 122 may control power to one or more components including the one or more drive units 120, the hardware processor 102 (e.g., CPU), the EC 104, the GPU 103, a video/graphic display device 144, or other wired I/O devices 142 such as the mouse 152, the stylus 148, a keyboard 146, and a trackpad 150 and other components that may require power when a power button has been actuated by a user. In an embodiment, the PMU 122 may monitor power levels and be electrically coupled to the information handling system 100 to provide this power. The PMU 122 may be coupled to the bus 118 to provide or receive data or machine-readable code instructions. The PMU 122 may regulate power from a power source such as the battery 124 or AC power adapter 126. In an embodiment, the battery 124 may be charged via the AC power adapter 126 and provide power to the components of the information handling system 100, via wired connections as applicable, or when AC power from the AC power adapter 126 is removed.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium 110 can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or machine-readable code instructions may be stored.

In other embodiments, dedicated hardware implementations such as application specific integrated circuits (ASICs), programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses hardware resources executing software or firmware, as well as hardware implementations.

As described herein, the information handling system 100 may include cooling systems, modules, and devices that cool heat-producing components within the information handling system 100. These heat-producing components may include a CPU, a GPU, other hardware processing devices, a battery, along with other heat-producing components within the housing of the information handling system 100. A liquid cooling module 156 described herein may be used as a cooling system that cools these heat-producing components described herein.

In an embodiment, the liquid cooling module 156 may be operatively coupled to, for example, a cold plate formed on top of the heat-producing component. The liquid cooling module 156 may be used to help transfer or circulate a coolant through the cold plate and back to the liquid cooling module 156. In an embodiment, the coolant may be water, deionized water, inhibited glycol and water solutions, and dielectric fluids, among other thermally conductive fluids. It is appreciated that any type of coolant may be used within the fluid channels of the liquid cooling module 156 and coolant system of the information handling system 100 and the present specification contemplates the use of these other types of coolants.

In an embodiment, the liquid cooling module 156 may include a heat exchanger 158. The heat exchanger 158 may be operatively and thermally coupled to the coolant within the liquid cooling module 156. In an embodiment, the heat exchanger 158 may include a set of stacked fins 162. These stacked fins 162 may be operatively coupled to the housing of the liquid cooling module 156, one or more coolant loop tube cores 160 of the liquid cooling module 156, and other hardware of the liquid cooling module 156 so that heat from the heated coolant (e.g., circulated from the heat-producing components and into the liquid cooling module 156) may be conducted from these heat-producing components and into the set of stacked fins 162. In an embodiment, a fan module 174 may be placed next to the set of stacked fins 162 and operatively coupled to the liquid cooling module 156 such that the fan module 174 can create an airflow over and/or through the set of stacked fins 162. In an embodiment, the heat exchanger 158 may include a housing into which the set of stacked fins 162 are placed and arranged to allow the airflow from the fan module 174 to pass over or through the set of stacked fins 162. Each of the stacked fins 162 of the set of stacked fins 162 may be made of a heat conductive material such as copper (Cu), aluminum (Al), stainless steel, and the like.

As described, the heat exchanger 158 also includes one or more coolant loop tube cores 160. Each of the coolant loop tube cores 160 may include a cylindrical, oval, squared, rectangular, or other shaped tube made of a heat conductive material such as copper, aluminum, and stainless steel in order to conduct heat from the coolant flowing through the coolant loop tube cores 160 into the set of stacked fins 162. In an embodiment, the coolant loop tube cores 160 may be formed through the set of stacked fins 162. In an embodiment, each of the stacked fins 162 within the set of stacked fins 162 may include a via through which the coolant loop tube cores 160 may pass and be secured within the heat exchanger 158. In an embodiment, the vias formed through the stacked fins 162 may be slightly larger than the diameter of the coolant loop tube cores 160 so that the coolant loop tube cores 160 may thermally interface with the stacked fins 162 via an engineering fit (e.g., press fit, driving fit, etc.) or a weld or other thermal coupling. In an embodiment, each of the stacked fins 162 of the set of stacked fins 162 may also be thermally coupled to coolant loop tube cores 160 of the heat exchanger 158 via, for example, welding or via an adhesive.

Each of the coolant loop tube cores 160 may be operatively coupled to a first manifold 166 at a proximal end of each of the coolant loop tube cores 160 and a second manifold 168 at a distal end of each of the coolant loop tube cores 160. The first manifold 166 and second manifold 168 may be used to house the coolant so that the coolant may be passed from the first manifold 166, through the coolant loop tube cores 160, and into the second manifold 168 in an example embodiment. In an embodiment, the first manifold 166 includes a coolant inlet port that is fluidically coupled to a cold plate formed at the heat-producing component and receives coolant passing from the cold plate. In an embodiment, the second manifold 168 includes a coolant outlet port to receive the coolant from the second manifold 168 and pass that coolant out of the second manifold 168 to the cold plate formed at the heat-producing component within the information handling system 100. Thus, the liquid cooling module 156 and cold plate formed at the heat-producing component forms a fluidic loop where relatively cool coolant is passed into the cold plate at the heat-producing component and discharged out of the cold plate via operation of the liquid cooling module 156 described herein.

Each of the coolant loop tube cores 160 formed through the stacked fins 162 includes an integrated screw pump 164 passed into the hollow of the coolant loop tube core 160. Each of the integrated screw pumps 164 is a positive-displacement pump (e.g., an Archimedes screw, hydrodynamic screw, or water screw) that uses one or more screws formed on a central shaft to move the coolant through the coolant loop tube cores 160 in an embodiment. Rotation of the integrated screw pumps 164 causes the coolant to pass from the first manifold 166 to the second manifold 168 during operation of the liquid cooling module 156 described herein and assists flow of the coolant.

Each of the integrated screw pumps 164 are operatively coupled to a screw pump drive system 170. The screw pump drive system 170 may be any drive system that turns each of the integrated screw pumps 164 within the respective coolant loop tube cores 160. In an embodiment, the screw pump drive system 170 driven by an electric motor includes a transmission system 172 that drives each of the integrated screw pumps 164 concurrently so that each of the integrated screw pumps 164 may pass the coolant from the first manifold 166, through the coolant loop tube cores 160, and into the second manifold 168. In an embodiment, the screw pump drive system 170 and transmission system 172 may be operatively coupled to the proximal ends of each of the integrated screw pumps 164 at the first manifold 166. In an embodiment, the transmission system 172 or portions of the transmission system 172 operatively coupled to the screw pump drive system 170, such as an electric motor powered by the PMU 122 may be formed and operatively coupled to or within the first manifold 166.

When referred to as a "system," a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a standalone device). The system, device, controller, or module can include hardware processing resources executing software, including firmware embedded at a device, such as an Intel® brand processor, AMD® brand processors, Qualcomm® brand processors, or other processors and chipsets, or other such hardware device capable of operating a relevant software environment of the information handling system. The system, device, controller, or module can also include a combination of the foregoing examples of hardware or hardware executing software or firmware. Note that an information handling system can include an integrated circuit or a board-level product having portions thereof that can also be any combination of hardware and hardware executing software. Devices, modules, hardware resources, or hardware controllers that are in communication with one another need not be in continuous communication with each other, unless expressly specified otherwise. In addition, devices, modules, hardware resources, and hardware controllers that are in communication with one another can communicate directly or indirectly through one or more intermediaries.

Figure 2A:
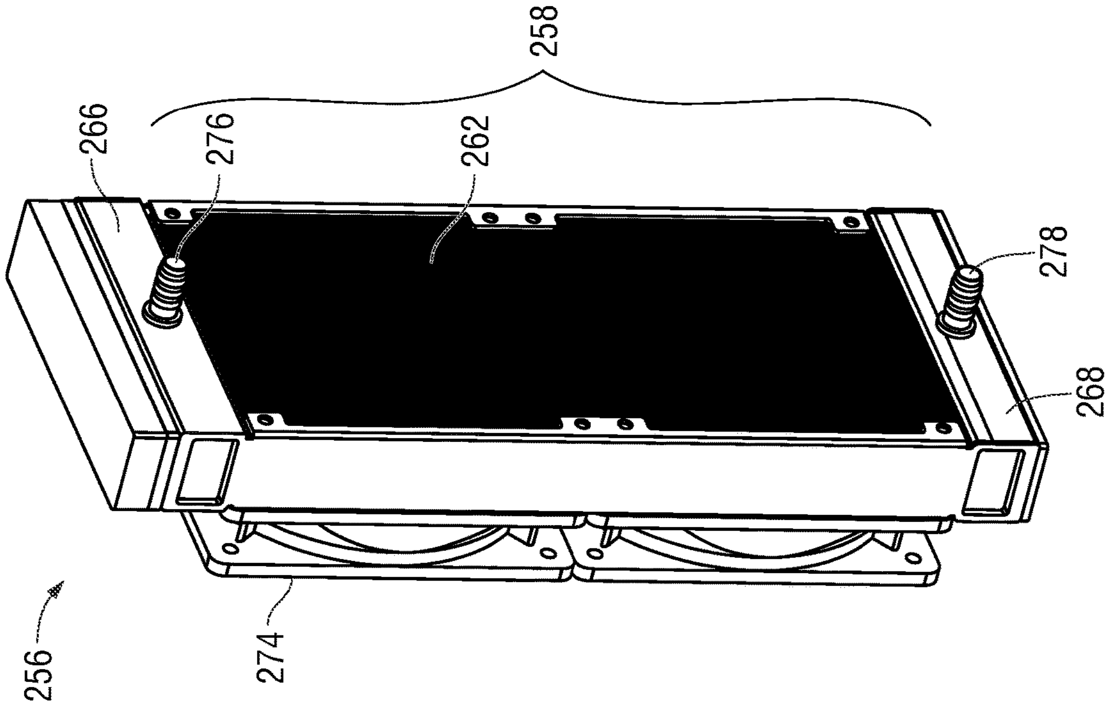
FIG. 2A is a perspective view of a liquid cooling module according to an embodiment of the present disclosure.
Figure 2B:
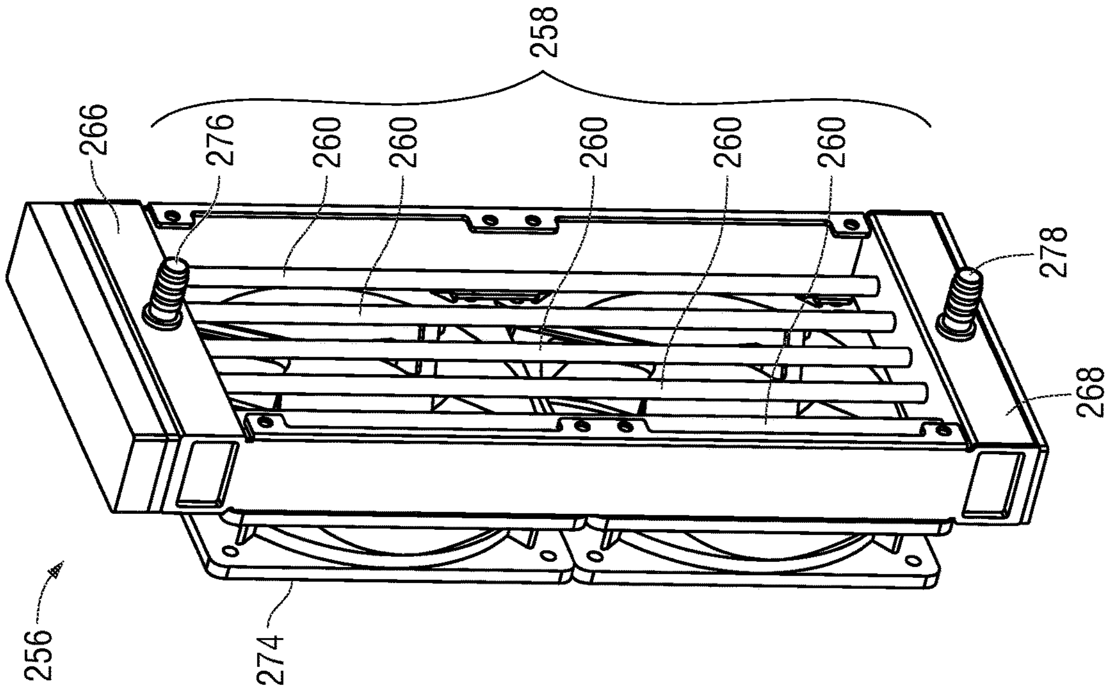
FIG. 2B is a perspective view of a liquid cooling module showing an array of coolant loop tube cores with a set of stacked fins removed according to another embodiment of the present disclosure.

FIG. 2A is a perspective view of a liquid cooling module 256 according to an embodiment of the present disclosure. Similarly, FIG. 2B is a perspective view of a liquid cooling module 256 with a set of stacked fins 262 of a heat exchanger 258 removed to show an array of coolant loop tube cores 260 according to another embodiment of the present disclosure. The liquid cooling module 256, as described herein, includes a heat exchanger 258 formed between the first manifold 266 and a second manifold 268. As shown in FIG. 2A, the heat exchanger 258 includes a set of stacked fins 262. FIG. 2B shows this set of stacked fins 262 removed to show the coolant loop tube cores 260 of heat exchanger 258 within and thermally coupling the heated coolant passing through the coolant loop tube cores 260 and the set of stacked fins 262.

As described herein, these stacked fins 262 may be operatively coupled to the housing of the liquid cooling module 256, one or more coolant loop tube cores 260 of the liquid cooling module 256, and other hardware of the liquid cooling module 256 so that heat from the heated coolant (e.g., circulated from the heat-producing components and into the liquid cooling module 156) may be conducted from these coolant loop tube cores 260 and into the set of stacked fins 262. In an embodiment, a fan module 274 may be placed next to the set of stacked fins 262 and operatively coupled to the liquid cooling module 256 such that the fan module 274 can create an airflow over and/or through the set of stacked fins 262. In an embodiment, the heat exchanger 258 may include a housing into which the set of stacked fins 262 are placed and arranged in the liquid cooling module 256 to allow the airflow from the fan module 274 to pass over or through the set of stacked fins 262. Each of the stacked fins 262 of the set of stacked fins 262 may be made of a heat conductive material such as copper (Cu), aluminum (Al), stainless steel, and the like.

As described, the heat exchanger 258 also includes one or more coolant loop tube cores 260 can be a square tube, rectangular tube, round tube, oval tube or other shape. Each of the coolant loop tube cores 260 may include a cylinder made of a heat conductive material such as copper, aluminum, and stainless steel in order to conduct heat from the coolant flowing through the coolant loop tube cores 260 into the set of stacked fins 262. In an embodiment, the coolant loop tube cores 260 may be formed through the set of stacked fins 262. In an embodiment, each of the stacked fins 262 within the set of stacked fins 262 may include a via through which the coolant loop tube cores 260 may pass and be secured within the heat exchanger 258. In an embodiment, the vias formed through the stacked fins 262 may be slightly larger than the diameter of the coolant loop tube cores 260 so that the coolant loop tube cores 260 may interface and thermally couple with the stacked fins 262 via an engineering fit (e.g., press fit, etc.) or via, for example, welding or an adhesive.

Each of the coolant loop tube cores 260 may be operatively coupled to a first manifold 266 at a proximal end of each of the coolant loop tube cores 260 and a second manifold 268 at a distal end of each of the coolant loop tube cores 260. The first manifold 266 and second manifold 268 may be used to house the coolant so that the coolant may be passed from the first manifold 266, through the coolant loop tube cores 260, and into the second manifold 268 in an example embodiment. In an embodiment, the first manifold 266 includes a coolant inlet port 276 that is fluidically coupled to the cold plate formed at the heat-producing component and receives coolant passing from the cold plate. In an embodiment, the second manifold 268 includes a coolant outlet port to receive the coolant from the second manifold 268 and pass that coolant out of the second manifold 268 to the cold plate (not shown) formed at the heat-producing component within the information handling system (not shown). Thus, the liquid cooling module 256 and cold plate formed at the heat-producing component forms a fluidic loop where relatively cold coolant is passed into the cold plate at the heat-producing component and discharged out of the cold plate via operation of the liquid cooling module 256 described herein. Therefore, heated coolant from the cold plate at the heat-producing component may pass from the cold plate and into the coolant inlet port 276.

In the embodiments described herein, this heated coolant is passed through the first manifold 266, the coolant loop tube cores 260, the second manifold 268 and out of the coolant outlet port 278 back to the cold plate at the heat-producing component.

The circulation of the coolant through the liquid cooling module 256 may be accomplished via the operation of the integrated screw pumps (not shown) formed in the coolant loop tube cores 260. Each of the integrated screw pumps is a positive-displacement pump (e.g., an Archimedes screw, hydrodynamic screw, or water screw) that uses one or more screws formed on a central shaft to move the coolant through the coolant loop tube cores 260 in an embodiment. Rotation of the integrated screw pumps causes the coolant to pass from the first manifold 266 to the second manifold 268 during operation of the liquid cooling module 256 described herein.

Each of the integrated screw pumps are operatively coupled to a screw pump drive system (not shown). The screw pump drive system may be any drive system that turns each of the integrated screw pumps within the respective coolant loop tube cores 260. In an embodiment, the screw pump drive system includes a transmission system (not shown) that drives each of the integrated screw pumps concurrently so that each of the integrated screw pumps may pass the coolant from the first manifold 266, through the coolant loop tube cores 260, and into the second manifold 268 and back to the cold plate at the heat-producing component. In an embodiment, the screw pump drive system and transmission system may be operatively coupled to the proximal ends of each of the integrated screw pumps at the first manifold 266. In an embodiment, the transmission system or portions of the transmission system operatively coupled to the screw pump drive system may be formed within the first manifold 266.

Figure 3:
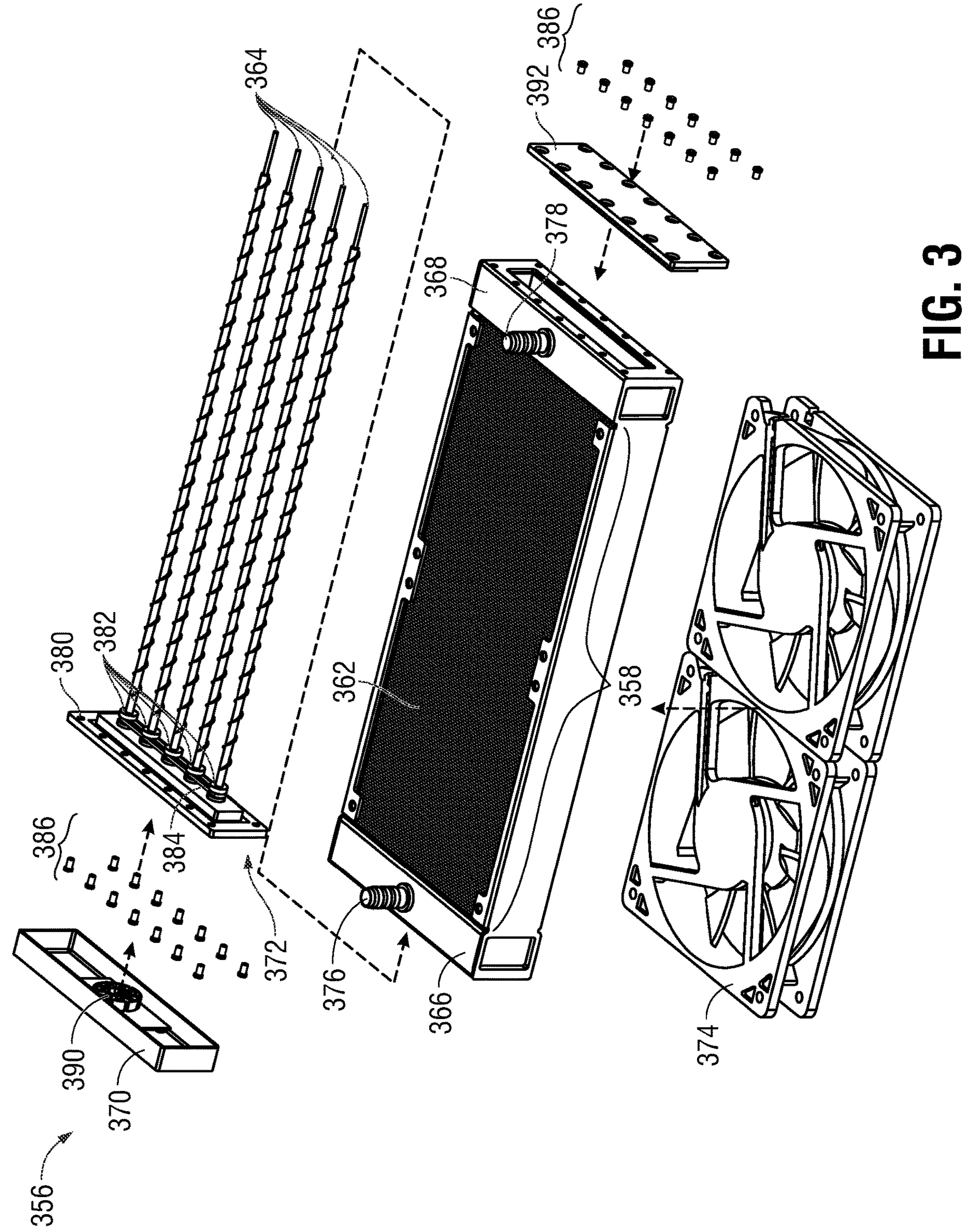
FIG. 3 is an exploded, perspective view of a liquid cooling module according to another embodiment of the present disclosure.

FIG. 3 is an exploded, perspective view of a liquid cooling module 356 according to another embodiment of the present disclosure. FIG. 3 shows the fan module 374 removed from the back of the liquid cooling module 356. Additionally, the transmission system 372 with the coupled screw pump drive system 370 such as an electric motor with a stator 390, have been removed from the heat exchanger 358. Still further, the integrated screw pumps 364 have been removed from within the coolant loop tube cores (not shown).

The liquid cooling module 356 is shown to have a heat exchanger 358 that includes a set of stacked fins 362 therein. Again, the heat exchanger 358 is operatively coupled to a first manifold 366 and a second manifold 368. The first manifold 366 and second manifold 368 is used to hold coolant therein for circulation of that coolant into the coolant inlet port 376 at the first manifold 366, through the first manifold 366, through the coolant loop tube cores (not shown) formed through the stacked fins 362 and heat exchanger 358, into the second manifold 368, and out of the coolant outlet port 378. Again, the coolant inlet port 376 and coolant outlet port 378 may be operatively coupled to other components of the cooling system described herein such as a cold plate located at a heat-producing component (e.g., CPU, GPU, battery, etc.) within the information handling system. Therefore, the liquid cooling module 356 described herein forms a fluidic loop with the cold plate to circulate the coolant to and from the cold plate.

As described herein, the liquid cooling module 356 includes a screw pump drive system 370 such as an electric motor with stator 390 and a rotator (not shown), formed at a proximal end of the liquid cooling module 356. In an embodiment, the screw pump drive system 370 may be used to drive one or more of the individual integrated screw pumps 364. In FIG. 3, the screw pump drive system 370 is operatively coupled to a transmission system 372 that is also used to drive the integrated screw pumps 364 placed within the coolant loop tube cores. In an embodiment, the screw pump drive system 370 includes a stator 390 as part of an electric motor. The stator 390 in the embodiments herein is used to electromagnetically drive a rotator (not shown) operatively coupled to a proximal cover 380 of the transmission system 372. In an embodiment, the stator 390 may be made of a ferromagnetic material such that application of a voltage or current via an electric motor printed circuit board (PCB) to causes the magnetic properties of the stator 390 to change and drive rotation of the rotator. This change in the magnetic properties of the stator 390 cause the rotator to spin.

As described herein, the transmission system 372 is operatively coupled to the screw pump drive system 370 via the stator 390 and the rotator. In an embodiment, the rotator may be mechanically coupled to a proximal end of one of the plurality of integrated screw pumps 364. In the embodiment shown in FIG. 3, the rotator is operatively coupled to a proximal end of a central integrated screw pump 364 placed between four of the five integrated screw pumps 364 shown. This allows the activation of the stator 390 to rotate the rotator and the centrally-oriented integrated screw pump 364 as shown. In an embodiment, the transmission system 372 further includes a wheel 382 formed along a shaft of each of the integrated screw pumps 364 and on a distal side of the proximal cover 380. These wheels 382 are operatively coupled together via a belt 384 placed into belt tracks formed into each of the wheels 382. The belt allows the rotation of the centrally-oriented integrated screw pump 364 to be transmitted to each of the other integrated screw pumps 364. Thus, rotation of the rotator by the stator 390 causes the mechanical rotation of the centrally-oriented integrated screw pump 364 which, via use of the belt 384 formed within the belt tracks of each of the wheels 382, causes the other four integrated screw pumps 364 to rotate. In an embodiment, the belt 384 and wheels 382 are housed within the first manifold 366. Therefore, in an embodiment, the coolant may be selected such that as the coolant passes through the first manifold 366, it may not interfere with the functioning of the wheels 382 and belt 384 during operation of the liquid cooling module 356.

The rotation of the integrated screw pumps 364 by the screw pump drive system 370 and transmission system 372 causes coolant to pass relatively quicker through the coolant loop tube cores formed within the heat exchanger 358 as described herein. As described herein, by increasing the flow rate of the coolant through the liquid cooling module 356 and its heat exchanger 358, an increase in heat displacement from within the liquid cooling module 356 and information handling system is realized. In some embodiments, by increasing the flow rate of the coolant through the coolant loop tube cores by 17%, a 9 to 12% increase in heat dissipation may be realized thereby increasing the efficiency of those heat-producing components cooled by the liquid cooling module 356. This increases the capacity for the information handling systems to provide, for example, more processes during operation thereby increasing user satisfaction.

FIG. 3 also shows a series of screws 386 used to secure the proximal cover 380 to the first manifold 366. It is appreciated that other types of fastening devices may be used to secure the proximal cover 380 to the first manifold 366 and the present specification contemplates the use of these other fastening devices. In an embodiment, prior to the proximal cover 380 being secured to the proximal end of the first manifold 366, a first manifold sealing ring (not shown) may be placed between the proximal cover 380 and the first manifold 366 to prevent coolant from leaking out of the first manifold 366 during operation. Similarly, a bottom plate 392 may be secured to a distal end of the second manifold 368 using a fastening device such as another set of screws 386. Again, a second manifold sealing ring (not shown) may be placed between the distal cover 392 and the second manifold 368 to prevent coolant from leaking out of the second manifold 368 during operation.

Figure 4A:
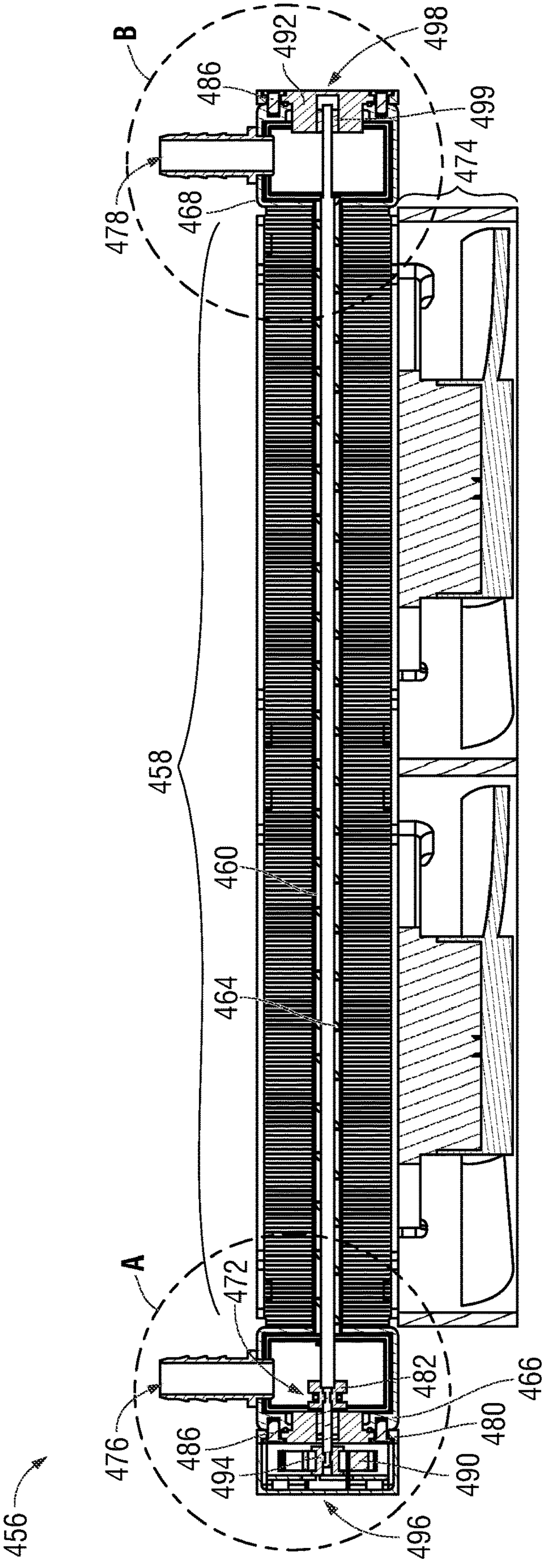
FIG. 4A is a cross-sectional view of a liquid cooling module with a coolant loop tube core according to an embodiment of the present disclosure.
Figure 4B:
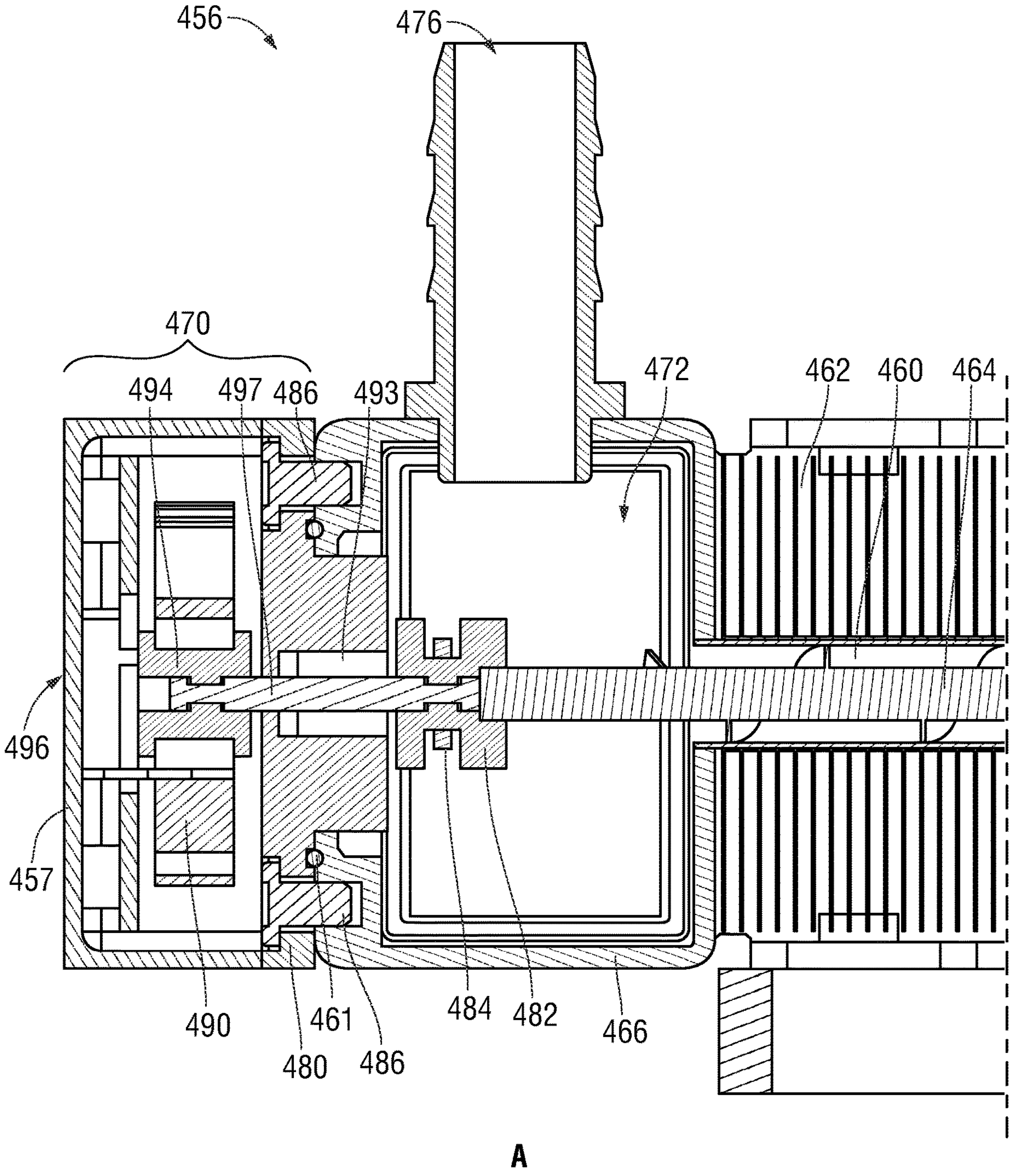
FIG. 4B is a cross-sectional, close-up view of a first manifold, screw pump drive system, transmission system, and integrated screw pumps of a liquid cooling module according to an embodiment of the present disclosure.
Figure 4C:
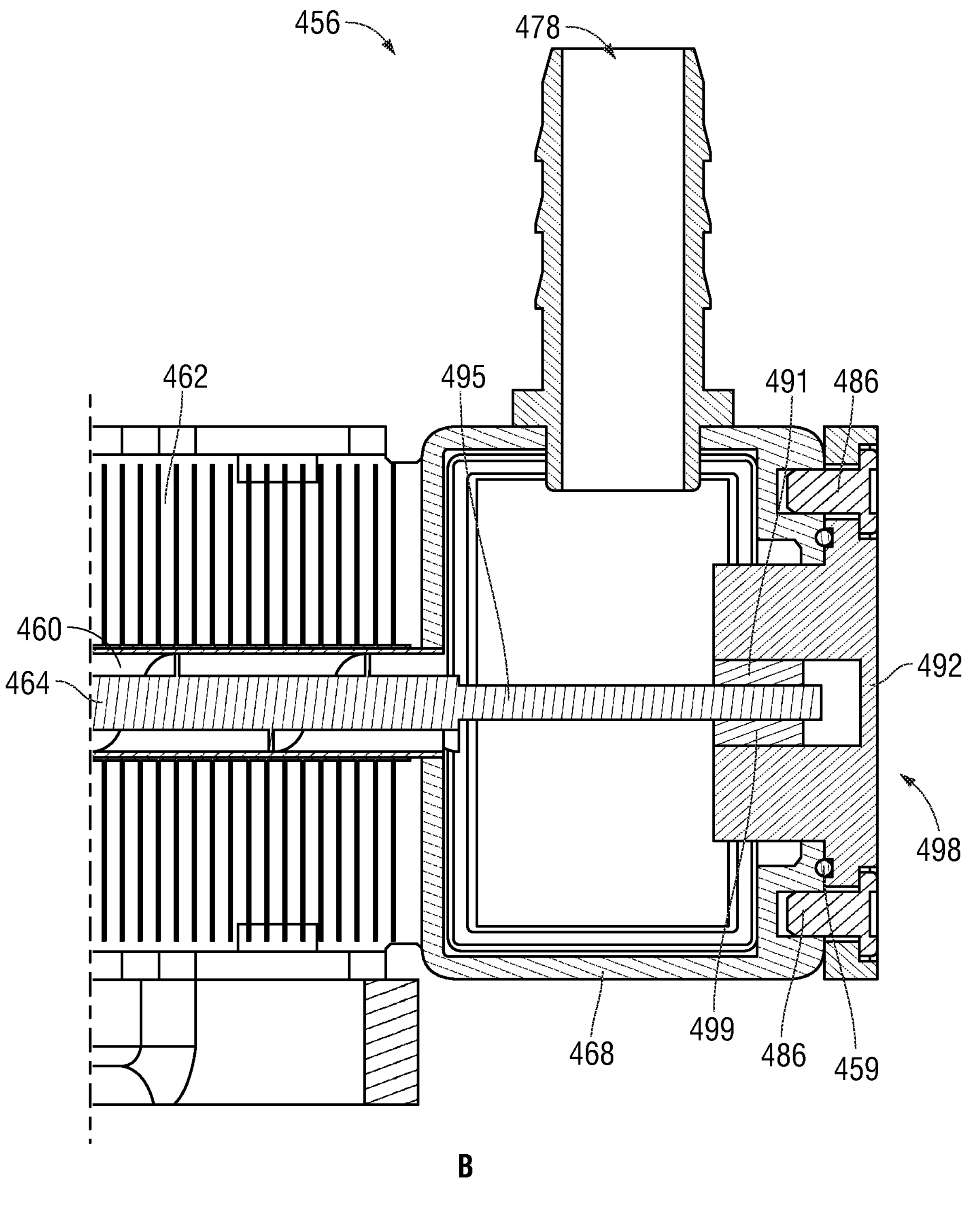
FIG. 4C is a cross-sectional, close-up view of a second manifold and integrated screw pumps according to an embodiment of the present disclosure.

FIG. 4A is a cross-sectional view of a liquid cooling module 456 according to another embodiment of the present disclosure. Additionally, FIG. 4B is a cross-sectional, close-up view of a first manifold 466, screw pump drive system 470, transmission system 472, and integrated screw pumps 464 of a liquid cooling module 456 according to another embodiment of the present disclosure. Additionally, FIG. 4C is a cross-sectional, close-up view of a second manifold 468 and integrated screw pumps 464 according to another embodiment of the present disclosure. FIG. 4B shows further details of the screw pump drive system 470, transmission system 472, first manifold 466, and integrated screw pump 464 as delineated by circle “A” in FIG. 4A. Additionally, FIG. 4C shows further close-up details of the integrated screw pumps 464 and second manifold 468 as delineated by circle “B” in FIG. 4A.

As described herein, the liquid cooling module 456 includes a heat exchanger 458. The heat exchanger 458 may be operatively and thermally coupled to the coolant within the liquid cooling module 456. In an embodiment, the heat exchanger 458 may include a set of stacked fins 462 and one or more coolant loop tube cores 460. These stacked fins 462 may be operatively coupled to the housing of the liquid cooling module 456, one or more coolant loop tube cores 460 of the liquid cooling module 456, and other hardware of the liquid cooling module 456 so that heat from the heated coolant (e.g., circulated from the heat-producing components and into the liquid cooling module 456) may be conducted from the coolant loop tube cores 460 and into the set of stacked fins 462. In an embodiment, a fan module 474 may be placed next to the set of stacked fins 462 and operatively coupled to the liquid cooling module 456 such that the fan module 474 can create an airflow over and/or through the set of stacked fins 462. In an embodiment, the heat exchanger 458 may include a housing into which the set of stacked fins 462 are placed and arranged to allow the airflow from the fan module 474 to pass over or through the set of stacked fins 462. Each of the stacked fins 462 of the set of stacked fins 462 may be made of a heat conductive material such as copper (Cu), aluminum (Al), stainless steel, and the like.

The heat exchanger 458 also includes one or more coolant loop tube cores 460. Each of the coolant loop tube cores 460 may include a cylindrical, oval, square, rectangular, or other shape to be made of a heat conductive material such as copper, aluminum, and stainless steel in order to conduct heat from the coolant flowing through the coolant loop tube cores 460 into the set of stacked fins 462. In an embodiment, the coolant loop tube cores 460 may be formed through the set of stacked fins 462. In an embodiment, each of the stacked fins 462 within the set of stacked fins 462 may include a via through which the coolant loop tube cores 460 may pass and be secured within the heat exchanger 458. In an embodiment, the vias formed through the stacked fins 462 may be slightly larger than the diameter of the coolant loop tube cores 460 so that the coolant loop tube cores 460 may interface with the stacked fins 462 via an engineering fit (e.g., press fit, driving fit, etc.). In an embodiment, each of the stacked fins 462 of the set of stacked fins 462 may be coupled to the coolant loop tube cores 460 the heat exchanger 458 via, for example, welding or via an adhesive. FIG. 4A through 4C shows a single coolant loop tube core 460 due to the cross-sectional view presented, however, the present specification contemplates that the liquid cooling module 456 may include a plurality of coolant loop tube cores 460 each with an integrated screw pump 464 passed therethrough.

FIG. 4B shows close-up views of an area near a proximal end 496 of the liquid cooling module 456 and delineated by circle "A" FIG. 4A. Both FIGS. 4A and 4B show the mechanical interfacing with the integrated screw pumps 464 and the screw pump drive system 470 and transmission system 472 described herein. As described herein, the screw pump drive system 470 includes a stator 490 that operates with or as part of an electrical motor housed within a motor cover 457. The stator 490 in the embodiments herein is used to mechanically drive a rotator 494, also housed within the motor cover 457 operatively coupled to an integrated screw pumps 464 that forms part of the transmission system 472. In an embodiment, the stator 490 may be made of a ferromagnetic material such that application of a voltage or current to the electric motor causes the magnetic properties of the stator 490 to change. This change in the magnetic properties of the stator 490 cause the rotator to spin. As shown in FIG. 4B the stator 490 is operatively coupled to a screw pump proximal shaft 497 of the integrated screw pump 464.

In an embodiment, the screw pump proximal shaft 497 extends through the proximal cover 480. A proximal bearing 493 is formed between the screw pump proximal shaft 497 and the proximal cover 480 such that the screw pump proximal shaft 497 is allowed to rotate by actuation of the stator 490 and operation of the rotator 494 as described herein. The proximal cover 480 is secured to the first manifold 466 via one or more fastening devices such as the screws 486 shown in FIG. 4B. Prior to coupling the proximal cover 480 to the first manifold 466, a proximal sealing ring 461 may be placed between a distal face of the proximal cover 480 and a surface of the first manifold 466. The proximal sealing ring 461 fluidically seals the coolant flowing in from the coolant inlet port 476 such that the coolant is kept in the first manifold 466 for staging as the coolant is passed into the coolant loop tube core 460 via operation of the integrated screw pump 464 described herein.

In an embodiment, the transmission system 472 further includes a wheel 482 formed along the screw pump proximal shaft 497 of each of the integrated screw pumps 464. The wheel 482 is placed on a distal side of the proximal cover 480. In an embodiment, the wheel 482 is operatively coupled to other wheels (not shown) of other integrated screw pumps via a belt 484 placed into belt tracks formed into each of the wheels 482 or otherwise causing wheels 482 to be rotated together. The belt 484 allows the rotation of a centrally-oriented integrated screw pump 464 (e.g., the integrated screw pump shown in FIGS. 4A and 4B) to be transmitted to each of the other integrated screw pumps 464. Thus, rotation of the rotator 494 by the stator 490 causes the mechanical rotation of the centrally-oriented integrated screw pump 464 which, via use of the belt 484 formed within the belt tracks of each of the wheels 482, causes the other integrated screw pumps 464 within the liquid cooling module 456 to rotate. In an embodiment, the belt 484 and wheels 482 are housed within the first manifold 466 and are in physical contact with the coolant within the first manifold 466. Therefore, in an embodiment, the coolant may be selected such that as the coolant passes through the first manifold 466, it may not interfere with the functioning of the wheels 482 and belt 484 during operation of the liquid cooling module 456.

FIG. 4C shows an area near a distal end 498 of the liquid cooling module 456 and delineated by circle "B" in FIG. 4A. Both FIGS. 4A and 4C show the mechanical interfacing with the integrated screw pumps 464 at the distal end of the liquid cooling module 456. The distal end 498 of the liquid cooling module 456 includes a second manifold 468 that holds an amount of coolant therein as the coolant passes from within the coolant loop tube core 460 via operation of the integrated screw pump 464, screw pump drive system 470, and transmission system 472 as described herein.

In an embodiment, the integrated screw pump 464 may include a screw pump distal shaft 495 that extends through the second manifold 468 and to the distal cover 492. In an embodiment, the distal cover 492 includes a distal bearing 499 into which the screw pump distal shaft 495 is placed. In an embodiment, the distal bearing 499 is formed into a via within the distal cover 492 such that the coupling of the distal cover 492 to the second manifold 468 via the screws 486 secures the screw pump distal shaft 495 in place. During operation of the liquid cooling module 456, the integrated screw pumps 464 are allowed to rotate within the proximal bearing 493 shown in FIGS. 4A and 4B as well as the distal bearing 499 shown in FIGS. 4A and 4C.

The second manifold 468 also includes a distal sealing ring 459 as well to fluidically seal the coolant within the second manifold 468. The distal sealing ring 459 may be placed between a proximal side of the distal cover 492 and a surface of the second manifold 468 prior to the screws 486 securing the distal cover 492 to the second manifold 468. Additionally, as described herein, the second manifold 468 includes a coolant outlet port 478 through which the coolant may pass to the remaining portions of the cooling system within the information handling system described herein.

During operation, a voltage or current is applied to an electric motor including the stator 490 which causes the rotator 494 to rotate via electromagnetic urging of the rotator 494 with current or voltage moving around the stator 490. Because the rotator 494 is operatively coupled to the screw pump proximal shaft 497, the rotation of the rotator 494 causes the integrated screw pump 464 to rotate such that the screws formed on the integrated screw pump 464 pulls an amount of coolant from within the first manifold 466 and through the coolant loop tube core 460. Because the liquid cooling module 456 may include multiple integrated screw pumps 464 formed within multiple coolant loop tube cores 460, the rotation of the integrated screw pump 464 shown in FIGS. 4A through 4C causes the rotation of other integrated screw pumps 464 through the use of the wheels 482 formed at the screw pump proximal shaft 497 and the belt 484 operatively coupling the rotation of the centrally-oriented integrated screw pump 464 to the other integrated screw pumps 464. As coolant is pulled through each of the coolant loop tube cores 460 the flow of the coolant may be increased depending on the speed of rotation of each of the integrated screw pumps 464. The coolant may then be passed into the second manifold 468 and, due to an increase in fluidic pressure within the second manifold 468, the coolant is forced out of the second manifold 468 via the coolant outlet port 478.

Because heated coolant is passed into the first manifold 466 and through the coolant loop tube cores 460, heat is dissipated from the coolant loop tube cores 460 to the stacked fins 462. Additionally, operation of the fan module 474 causes an airflow to be passed over and/or through the set of stacked fins 462 dissipating heat out of the heat exchanger 458. In an embodiment, the side of the heat exchanger 458 opposite the fan module 474 may be placed at a vent formed into a housing of the information handling system such that the heated air may pass out of the housing of the information handling system.

Figure 5:
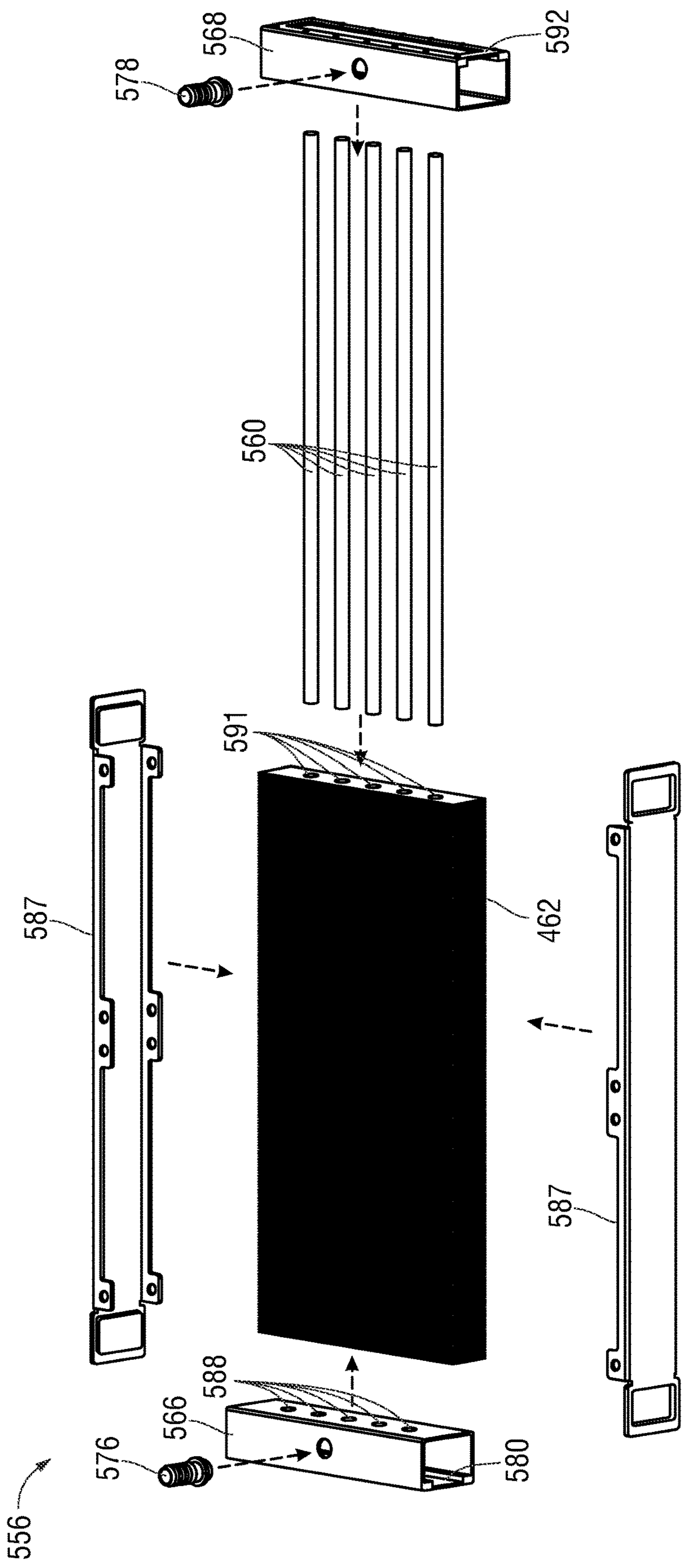
FIG. 5 is an exploded, perspective view of a liquid cooling module showing an array of coolant loop tube cores according to another embodiment of the present disclosure.

FIG. 5 is an exploded, perspective view of a liquid cooling module 556 showing elements of the heat exchanger according to another embodiment of the present disclosure. The exploded view shown in FIG. 5 shows the arrangement of the coolant loop tube cores 560 relative to the stacked fins 562 of the heat exchanger. As described herein, each of the stacked fins 562 of the set of stacked fins 562 may include one or more coolant loop tube core vias 591 formed therethrough. The number of these coolant loop tube core vias 591 may match the number of coolant loop tube cores 560 of the liquid cooling module 556 such that each coolant loop tube core 560 may be passed into their respective coolant loop tube core vias 591 and through the entire stack of the stacked fins 562 to form the heat exchanger of the liquid cooling module 556. In an embodiment, the coolant loop tube core vias 591 formed through the stacked fins 562 may be slightly larger than the diameter of the coolant loop tube cores 560 so that the coolant loop tube cores 560 may interface with the stacked fins 562 via an engineering fit (e.g., press fit, driving fit, etc.). In an embodiment, each of the stacked fins 562 of the set of stacked fins 562 may be thermally coupled to the coolant loop tube cores 560 the heat exchanger via, for example, welding or via an adhesive after the coolant loop tube cores 560 have been passed into the coolant loop tube core vias 591.

FIG. 5 also shows the first manifold 566 that includes a proximal cover 580 as described herein. The first manifold 566 may have one or more first manifold vias 588 formed therein. These first manifold vias 588 are formed to receive each of the coolant loop tube cores 560. In an embodiment, the coolant loop tube cores 560 may fitted into the coolant loop tube core vias 591 via an engineering fit. In another embodiment, the ends of the coolant loop tube core 560 may be coupled to the coolant loop tube core vias 591 via a welding process or thermal coupling material or adhesive. In an embodiment, the interface between the coolant loop tube core 560 and the first manifold vias 588 may be fluidically sealed such that coolant within the first manifold 566 cannot leak out of the first manifold 566. FIG. 5 also shows a coolant inlet port 576 formed into the first manifold 566. In an embodiment, the coolant inlet port 576 may be barbed such that a hose or pipe may be secured onto the coolant inlet port 576.

The liquid cooling module 556 also includes a second manifold 568 as described herein. Similar to the first manifold vias 588 for the first manifold 566, the second manifold 568 may also include second manifold vias (not shown) that allow the coolant loop tube cores 560 to be coupled to the second manifold 568. Again, the interface between the coolant loop tube core 560 and the second manifold vias may be fluidically sealed such that coolant within the second manifold 568 cannot leak out of the second manifold 568. FIG. 5 also shows a coolant outlet port 578 formed into the second manifold 568. In an embodiment, the coolant outlet port 578 may be barbed such that a hose or pipe may be secured onto the coolant outlet port 578.

The liquid cooling module 556 further includes side brackets 587 that hold the liquid cooling module 556 and its heat exchanger together and provide support for other components of the liquid cooling module 556. In an embodiment, the side brackets 587 are operatively coupled to the first manifold 566 and second manifold 568 such that they form a wall within the first manifold 566 and second manifold 568. Again, the side brackets 587 may be secured to each of the first manifold 566 and second manifold 568 such that it creates a fluidic seal in order to prevent coolant from leaking out of the first manifold 566 and second manifold 568.

Figure 6A:
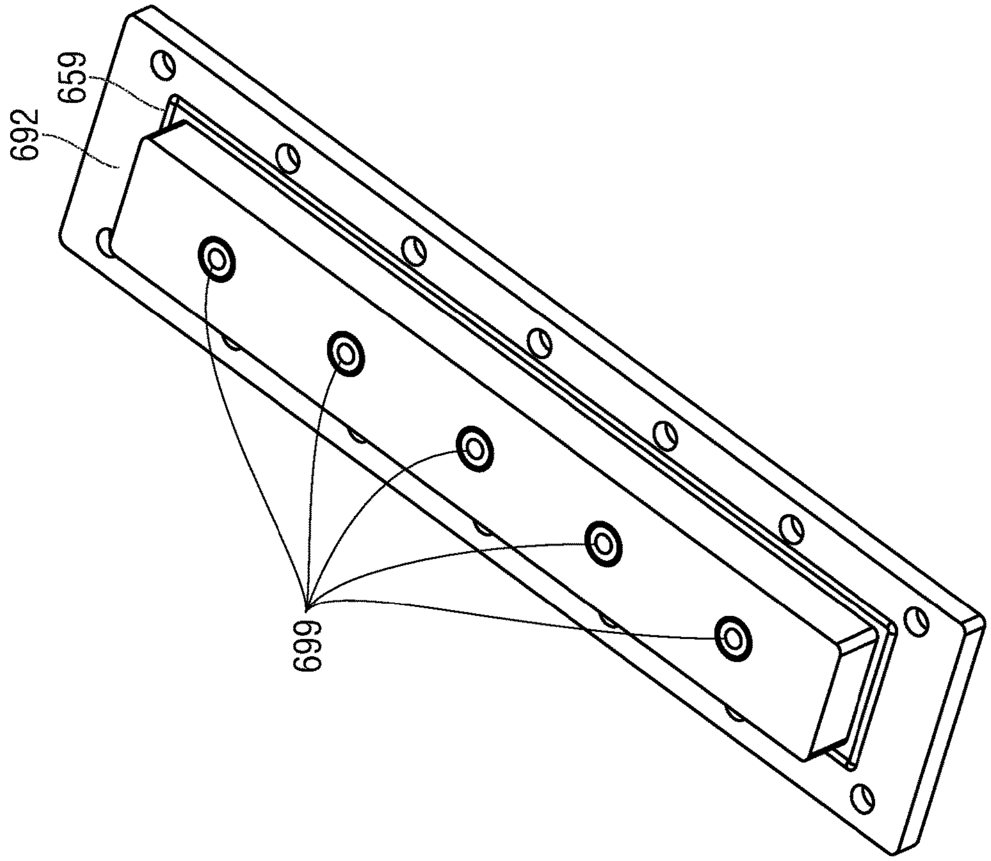
FIG. 6A is a perspective view of a distal cover of a second manifold of the liquid cooling module according to another embodiment of the present disclosure.

FIG. 6A is a perspective view of a distal cover 692 of a second manifold 668 of the liquid cooling module 656 according to another embodiment of the present disclosure. Additionally, FIG. 6B is a perspective, exploded view of a distal cover 692 of a second manifold 668 of the liquid cooling module 656 according to another embodiment of the present disclosure.

Figure 6B:
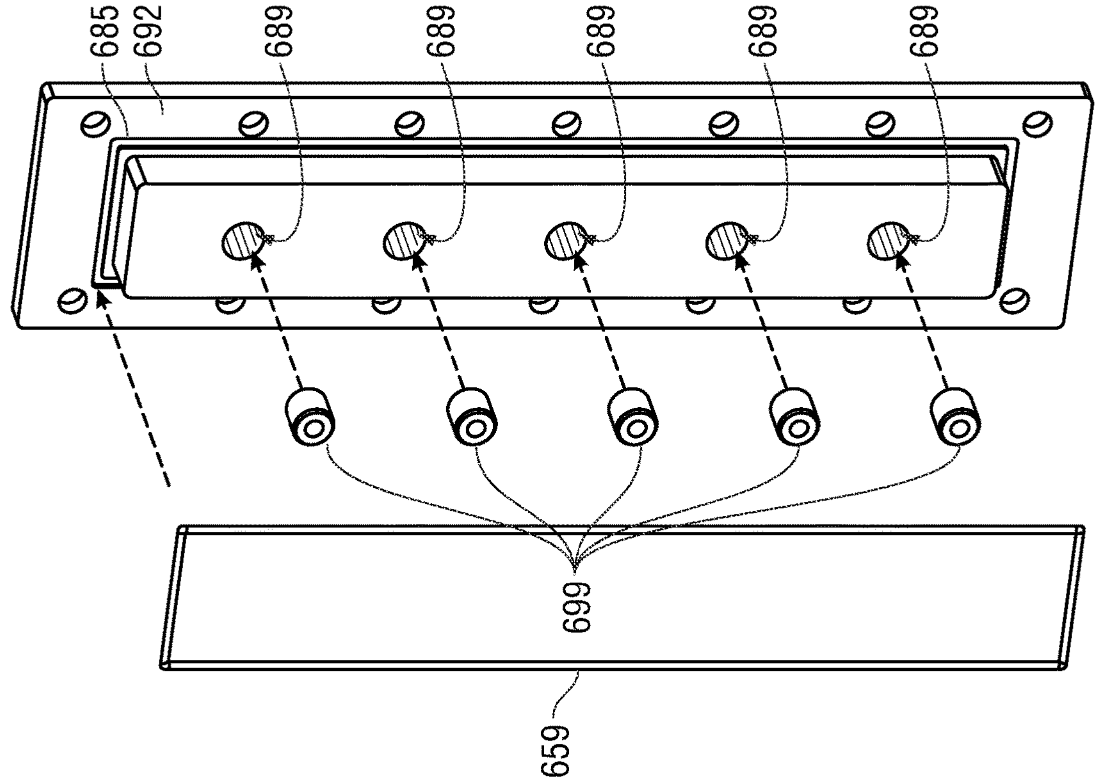
FIG. 6B is a perspective, exploded view of a distal cover of the second manifold of the liquid cooling module according to another embodiment of the present disclosure.

FIGS. 6A and 6B show the arrangement of the distal bearings 699 formed into the distal cover 692. As describe herein, each of the distal bearings 699 may receive a screw pump distal shaft therein to allow the integrated screw pumps to rotate freely. In an embodiment, each distal bearing 699 may be placed within a distal bearing via 689. In an embodiment, the distal bearing 699 may be fitted into the distal bearing via 689 using an engineering fit so that the distal bearing 699 cannot be removed from within the distal bearing vias 689.

The distal cover 692 further includes a distal sealing ring channel 685 that receives a distal sealing ring 659. In an embodiment, the size of the distal sealing ring 659 and distal sealing ring channel 685 may be selected such that as the distal cover 692 is fastened to the second manifold, the distal sealing ring 659 is pressed between the distal cover 692 and the second manifold. This fluidically seals the second manifold thereby preventing coolant from leaking out of the second manifold.

Figure 7A:
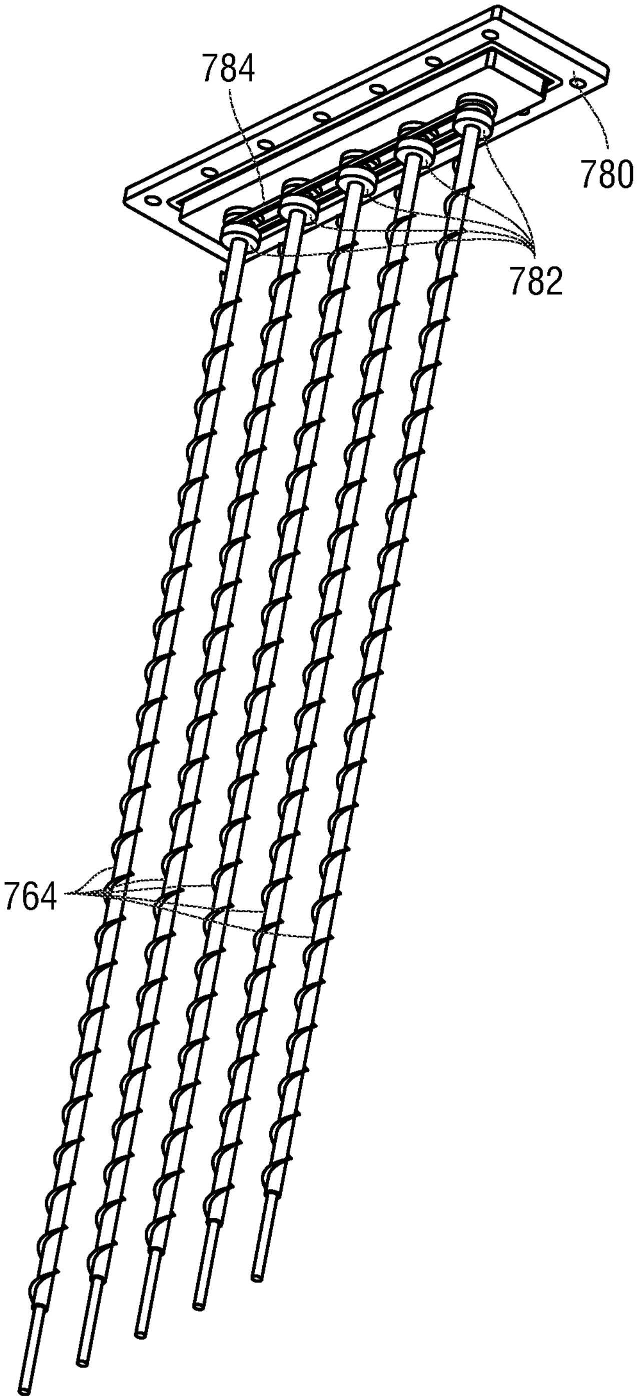
FIG. 7A is a perspective view of a proximal cover of the first manifold with a set of screw pumps operatively coupled to the proximal cover according to another embodiment of the present disclosure.
Figure 7B:
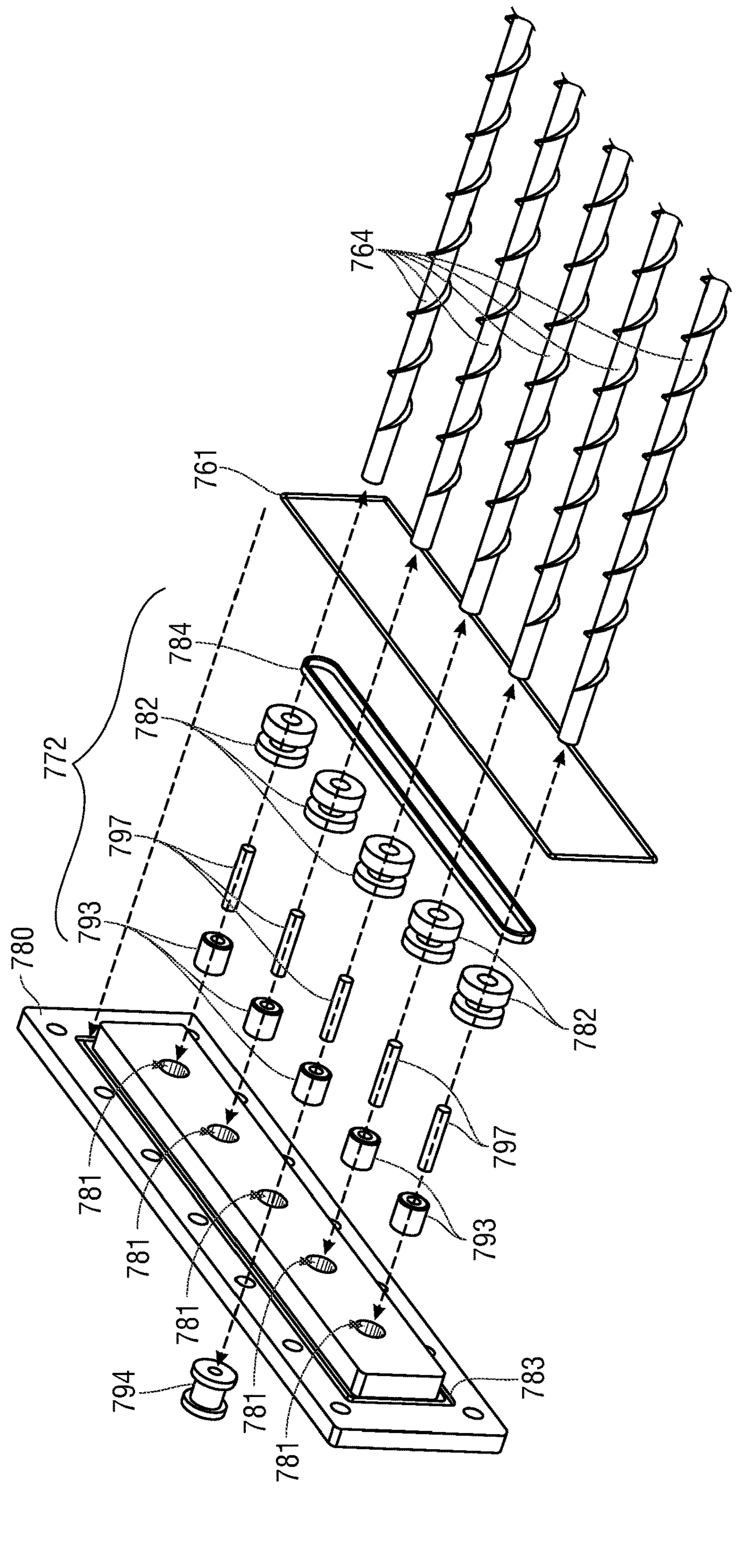
FIG. 7B is a perspective, exploded view of the proximal cover of the first manifold with a set of screw pumps operatively couplable to the proximal cover according to another embodiment of the present disclosure.

FIG. 7A is a perspective view of the proximal cover 780 of the first manifold with as set of integrated screw pumps 764 operatively coupled to the proximal cover 780 according to another embodiment of the present disclosure. FIG. 7B is a perspective, exploded view of the proximal cover of the first manifold with as set of screw pumps 764 operatively couplable to the proximal cover according to another embodiment of the present disclosure. FIGS. 7A and 7B show the integrated screw pumps 764 and proximal cover 780 being separated from the first manifold, second manifold, and the coolant loop tube cores described herein.

As described herein, a rotator 794 is operatively coupled to one of the integrated screw pumps 764 among a plurality of integrated screw pumps 764. As described herein, this integrated screw pump 764 to which the rotator 794 is coupled may be a centrally-oriented integrated screw pump 764 in an embodiment. This centrally-oriented integrated screw pump 764, as shown in FIGS. 7A and 7B are flanked by two sets of two other integrated screw pumps 764 such that there is a total of five integrated screw pumps 764 in the example embodiment. Although FIGS. 7A and 7B show a total of five integrated screw pumps 764, the present specification contemplates that more or fewer integrated screw pumps 764 may be included.

In an embodiment, the screw pump proximal shaft 797 may be a separate piece apart from each of the integrated screw pumps 764 that extends into or through the proximal cover 480. In the example shown in FIG. 7B for example, the screw pump proximal shaft 797 operatively coupled to the centrally-oriented integrated screw pump 764 is longer so that it may extend through the proximal cover 780 to be coupled to the rotator 794. Additionally, the other screw pump proximal shafts 797 associated with the other integrated screw pumps 764 may be relatively shorter such that they do not extend through the proximal cover 780. It is appreciated that, although FIGS. 7A and 7B may show the screw pump proximal shafts 797 being separate pieces operatively couplable to each integrated screw pumps 764, the screw pump proximal shafts 797 may form a monolithic piece with the integrated screw pumps 764 in an embodiment. Where the screw pump proximal shafts 797 are separable from each of the integrated screw pumps 764, a distal end of each screw pump proximal shaft 797 may be formed such that it may be pressed or fitted into a keyway formed into a proximal end of each integrated screw pump 764 such that rotation of the screw pump proximal shafts 797 cause the integrated screw pumps 764 to also rotate. In an embodiment, screw pump proximal shafts 757 may be secured into the integrated screw pumps 764 in a thread reverse of rotation of the integrated screw pumps 764.

In an embodiment, a proximal bearing 793 is formed between each of the screw pump proximal shafts 797 and the proximal cover 780 such that the screw pump proximal shafts 797 are allowed to rotate by actuation of the stator and operation of the rotator 794 as described herein. In an embodiment, a plurality of proximal bearing vias 781 may be formed into or through the proximal cover 780 such that a proximal bearing 793 may be placed within each of the proximal bearing vias 781. Again, each of the proximal bearing vias 781 and proximal bearings 793 may be sized such that an engineering interference fit may be formed between the proximal bearing vias 781 and proximal bearings 793 so that the proximal bearings 793 are not removed from each proximal bearing via 781.

As described herein, the proximal cover 780 is secured to the first manifold (not shown) via one or more fastening devices such as screws (e.g., those shown in FIG. 4B). Prior to coupling the proximal cover 780 to the first manifold, a proximal sealing ring 761 may be placed between a distal face of the proximal cover 780 and a surface of the first manifold. In an embodiment, a proximal sealing ring channel 783 is formed into a distal side of the proximal cover 780 to receive the proximal sealing ring 761. The proximal sealing ring 761 fluidically seals the coolant flowing in from the coolant inlet port (not shown) such that the coolant is kept in the first manifold for staging as the coolant is passed into the coolant loop tube cores (not shown) via operation of the integrated screw pumps 764 described herein.

In an embodiment, the transmission system 772 further includes a wheel 782 formed along the screw pump proximal shaft 797 of each of the integrated screw pumps 764. The wheel 782 is placed on a distal side of the proximal cover 780. In an embodiment, the wheel 782 is operatively coupled to other wheels 793 of other integrated screw pumps via a belt 784 placed into belt tracks formed into each of the wheels 782. The belt 784 allows the rotation of a centrally-oriented integrated screw pump 764 to be transmitted to each of the other integrated screw pumps 764. Thus, rotation of the rotator 794 by the stator causes the mechanical rotation of the centrally-oriented integrated screw pump 764 which, via use of the belt 784 formed within the belt tracks of each of the wheels 782, causes the other integrated screw pumps 764 within the liquid cooling module to rotate. In an embodiment, the belt 784 and wheels 782 are housed within the first manifold and are in physical contact with the coolant within the first manifold. Therefore, in an embodiment, the coolant may be selected such that as the coolant passes through the first manifold 766, it may not interfere with the functioning of the wheels 782 and belt 784 during operation of the liquid cooling module 756.

Figure 8B:
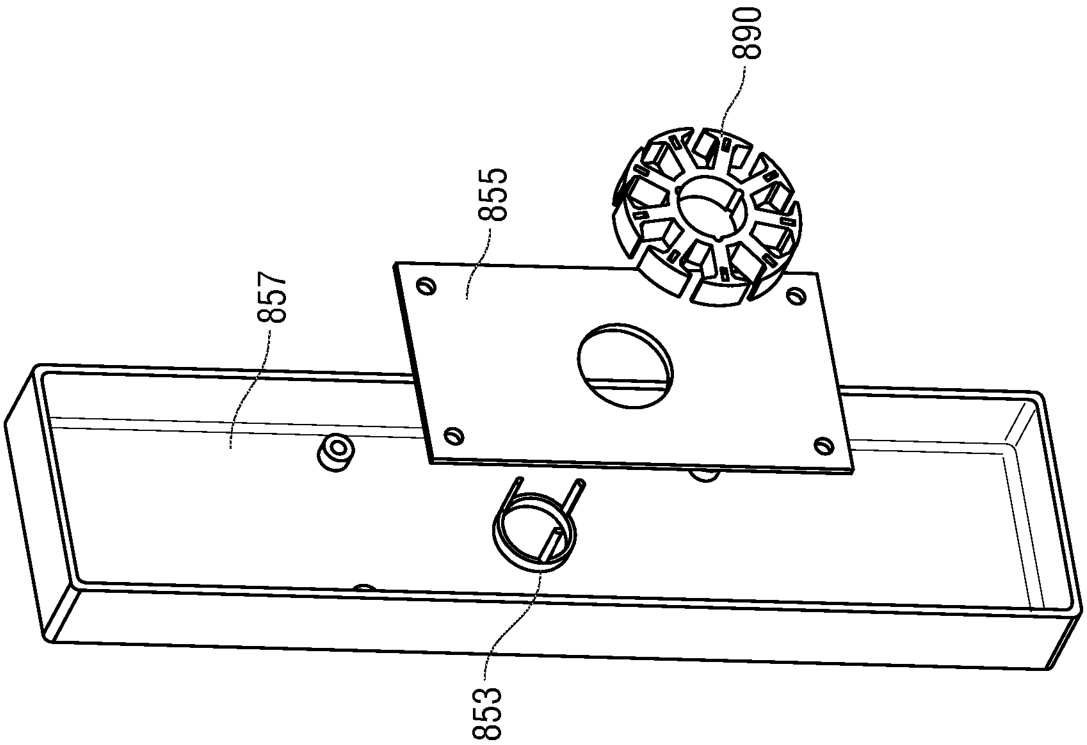
FIG. 8B is a perspective, exploded view of a motor cover of a screw pump drive system for a liquid cooling module according to another embodiment of the present disclosure.
Figure 8A:
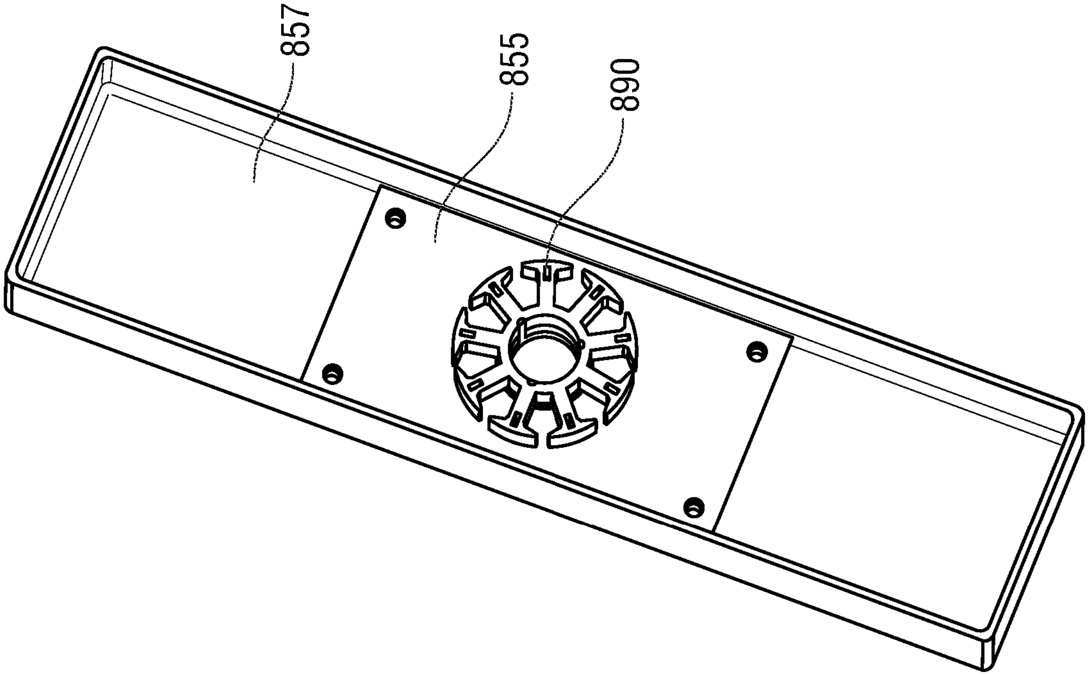
FIG. 8A is a perspective view of a motor cover of a screw pump drive system for a liquid cooling module according to another embodiment of the present disclosure.

FIG. 8A is a perspective, bottom view motor cover 857 and motor of a screw pump drive system of a liquid cooling module according to another embodiment of the present disclosure. Further, FIG. 8B is a perspective, exploded, bottom view of a motor cover 857 and motor of a screw pump drive system of a liquid cooling module according to another embodiment of the present disclosure. The motor cover 857 and motor in an embodiment may be operatively couplable to the proximal cover of the first manifold described herein.

The motor cover 857 may be used to house and cover the stator 890 and stator PCB 855 placed within the motor cover 857 in order to electrically activate the stator 890 with stator PCB 855. In an embodiment, the stator PCB 855 may include electrical circuitry that operatively couples the stator 890 to an electrical source such as a battery or A/C source. In an embodiment, the stator PCB 855 may be operatively coupled to the PMU of the information handling system via wiring or a power rail such that the PMU may operate as the electrical source to the stator 890 and stator PCB 855 operatively coupled to the electric motor components. In an embodiment, the PMU may also be operatively coupled to a hardware processing device (e.g., CPU, GPU, EC) in an information handling system that controls the activation and deactivation of the stator 890 depending on thermal conditions and thermal control. In an embodiment, the activation and deactivation if the stator 890 may be controlled by the hardware processing device based on detected temperature values obtained via a temperature sensor at, for example, the heat-producing component and a thermal control system of the information handling system.

In an embodiment, a stator PCB and stator mount 853 may be formed within the motor cover 857. The stator PCB and stator mount 853 may be used to hold the stator PCB 855 and stator 890 in place within the motor cover 857.

In an embodiment, during operation, a voltage or current may be applied to the stator 890 via wiring or a power rail. This application of the voltage or current may cause a magnetic field to be created, sequentially, around a core formed in the stator 890. This sequentially created magnetic field interacts electromagnetically with the rotator placed within the core of the stator 890 thereby causing the rotator (e.g., 494, FIG. 4B) to spin. This rotation of the rotator may be increased by increasing the speed of the magnetic field created, sequentially, around the stator 890. It is appreciated that other forms of motors may be used and the motor that includes the stator 890 and rotator is one example that may be used to rotate the integrated screw pumps described herein.

Figure 9:
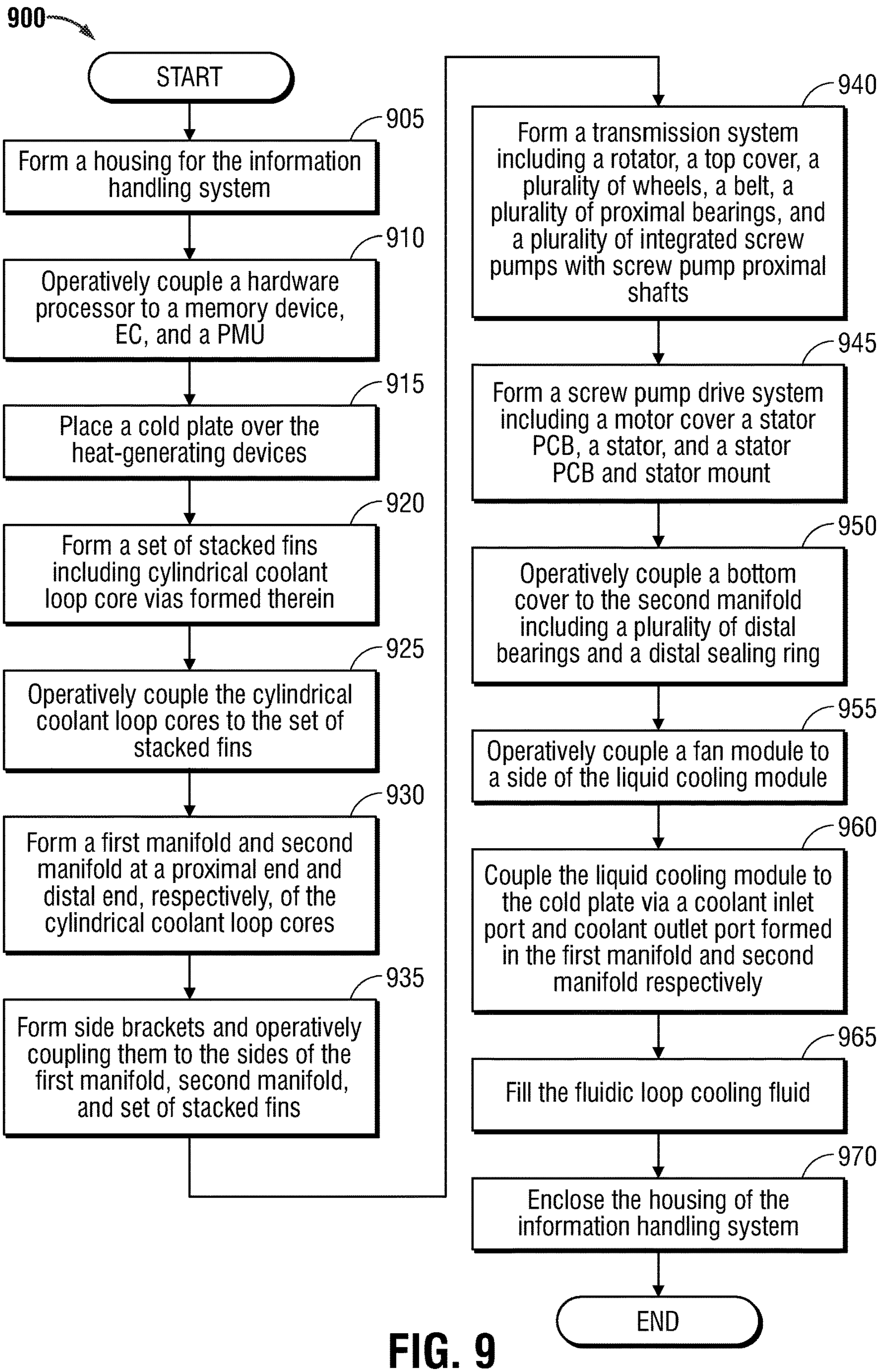
FIG. 9 is a flow diagram illustrating a method of manufacturing an information handling system comprising a liquid cooling module according to an embodiment of the present disclosure.

FIG. 9 is a flow diagram illustrating a method 900 of manufacturing an information handling system comprising a liquid cooling module according to an embodiment of the present disclosure. The method 900 may include, at block 905, forming a housing for the information handling system. As described herein, the information handling system may be any type of information handling system which may include a desktop-type information handling system for example. The housing may include, in an embodiment, a vent that may allow heated air from the liquid cooling module to be expelled from within the housing.

In an embodiment, the housing of the information handling system may be used to house the liquid cooling module as well as other components of the information handling system such as the hardware processors, memory devices, embedded controllers (ECs), and PMU, among other components. At block 910, the method 900 may include operatively coupling the hardware processing devices to a memory device, EC, and a PMU. In an embodiment, a printed circuit board (PCB) may be used to operatively couple these different devices together.

At block 915, the method 900 may include placing a cold plate onto a heat-producing component. As described herein, the cold plate may include a fluid path through which a coolant may be circulated therethrough in order to conduct heat away from the heat-producing component (e.g., CPU, GPU, power source, etc.), through the cold plate and into the coolant. As described herein, the cold plate may be operatively and fluidically coupled to the liquid cooling module described herein.

The liquid cooling module may also be formed. In an embodiment, the formation of the liquid cooling module may include, at block 920, forming a set of stack fins that each include one or more coolant loop tube core vias. Each of the stacked fins, in an embodiment, may be made of a heat conductive material such as copper (Cu), aluminum (Al), stainless steel, and the like.

At block 925, a set of coolant loop tube cores may be operatively coupled to the set of stacked fins. In an embodiment, this may be done by passing the coolant loop tube cores through their respective coolant loop tube core vias formed into the set of stacked fins. Each of the coolant loop tube cores may include a cylindrical, oval, squared, rectangular, or other tube made of a heat conductive material such as copper, aluminum, and stainless steel in order to conduct heat from the coolant flowing through the coolant loop tube cores into the set of stacked fins. In an embodiment, the vias formed through the stacked fins may be slightly larger than the diameter of the coolant loop tube cores so that the coolant loop tube cores may interface with the stacked fins via an engineering fit (e.g., press fit, driving fit, etc.). In an embodiment, each of the stacked fins of the set of stacked fins may be thermally coupled to the coolant loop tube cores the heat exchanger via, for example, welding or via an adhesive.

The method 900 may also include forming a first manifold and second manifold at a proximal end and distal end, respectively, of the coolant loop tube cores at block 930. As described herein, the first manifold may include first manifold vias into which the coolant loop tube cores may be inserted into and coupled to the first manifold. In an embodiment, this may be done by, for example, welding the coolant loop tube cores to their respective first manifold vias or press fitting the coolant loop tube cores into the first manifold vias using an engineering fit. The interface between the coolant loop tube cores and the first manifold vias may be fluidically sealed such that coolant in the first manifold cannot leak out at this interface. The second manifold also includes a set of second manifold vias into which the distal ends of the coolant loop tube cores may be inserted into. Again, this may be done by, for example, welding the coolant loop tube cores to their respective second manifold vias or press fitting the coolant loop tube cores into the second manifold vias using an engineering fit in order to create a fluidic seal.

At block 935, the method 900 includes forming side brackets and operatively coupling the side brackets to the sides of the first manifold, second manifold, and set of stacked fins. In an embodiment, the side brackets are operatively coupled to the first manifold and second manifold such that they form a wall within the first manifold and second manifold. Again, the side brackets may be secured to each of the first manifold and second manifold such that it creates a fluidic seal in order to prevent coolant from leaking out of the first manifold and second manifold.

At block 940, the method 900 includes forming a transmission system including a rotator, a proximal cover, a plurality of wheels, a belt, a plurality of proximal bearings, and a plurality of integrated screw pumps with screw pump proximal shafts. As described herein, a rotator is operatively coupled to one of the integrated screw pumps among a plurality of integrated screw pumps. As described herein, this integrated screw pump to which the rotator is coupled may be a centrally-oriented integrated screw pump. This centrally-oriented integrated screw pump may be flanked by two sets of two other integrated screw pumps such that there is a total of five integrated screw pumps in the example embodiment. Although embodiments described herein describe a total of five integrated screw pumps, the present specification contemplates that more or fewer integrated screw pumps may be included.

In an embodiment, the screw pump proximal shaft may be a separate piece apart from each of the integrated screw pumps that extends into or through the proximal cover of the first manifold. In the example, the screw pump proximal shaft operatively coupled to the centrally-oriented integrated screw pump is longer so that it may extend through the proximal cover to be coupled to the rotator. Additionally, the other screw pump proximal shafts associated with the other integrated screw pumps may be relatively shorter such that they do not extend through the proximal cover. It is appreciated that the screw pump proximal shafts may be separate pieces operatively couplable to each integrated screw pumps or the screw pump proximal shafts may form a monolithic piece with the integrated screw pumps. Where the screw pump proximal shafts are separable from each of the integrated screw pumps, a distal end of each screw pump proximal shaft may be formed such that it may be pressed or fitted into a keyway formed into a proximal end of each integrated screw pump or screwed into the same with an opposite oriented threading such that rotation of the screw pump proximal shafts cause the integrated screw pumps to also rotate.

In an embodiment, a proximal bearing is formed between each of the screw pump proximal shafts and the proximal cover such that the screw pump proximal shafts are allowed to rotate by actuation of the stator with current and voltage via a stator PCB and operation of the rotator by magnetic movement from the stator as described herein. In an embodiment, a plurality of proximal bearing vias may be formed into or through the proximal cover such that a proximal bearing may be placed within each of the proximal bearing vias. Again, each of the proximal bearing vias and proximal bearings may be sized such that an engineering interference fit may be formed between the proximal bearing vias and proximal bearings so that the proximal bearings are not removed from each proximal bearing via.

As described herein, the proximal cover is secured to the first manifold via one or more fastening devices such as screws. Prior to coupling the proximal cover to the first manifold, a proximal sealing ring may be placed between a distal face of the proximal cover and a surface of the first manifold. In an embodiment, a proximal sealing ring channel is formed into a distal side of the proximal cover to receive the proximal sealing ring. The proximal sealing ring fluidically seals the coolant flowing in from the coolant inlet port such that the coolant is kept in the first manifold for staging as the coolant is passed into the coolant loop tube cores via operation of the integrated screw pumps described herein.

In an embodiment, the transmission system further includes a wheel formed along the screw pump proximal shaft of each of the integrated screw pumps. The wheel is placed on a distal side of the proximal cover. In an embodiment, the wheel is operatively coupled to other wheels of other integrated screw pumps via a belt placed into belt tracks formed into each of the wheels. The belt allows the rotation of a centrally-oriented integrated screw pump to be transmitted to each of the other integrated screw pumps. Thus, rotation of the rotator by the stator causes the mechanical rotation of the centrally-oriented integrated screw pump which, via use of the belt formed within the belt tracks of each of the wheels, causes the other integrated screw pumps within the liquid cooling module to rotate. In an embodiment, the belt and wheels are housed within the first manifold and are in physical contact with the coolant within the first manifold.

The method 900 may also include forming a screw pump drive system that includes a motor cover, a stator PCB, a stator, and a stator PCB and stator mount to receive and rotate the rotator and at least one of the integrated screw pumps at block 945. As described herein, the motor cover in an embodiment may be operatively couplable to the proximal cover of the first manifold described herein. The motor cover may be used to house and cover the stator, rotator, and stator PCB placed within the motor cover in order to electrically isolate the stator, rotator, and stator PCB form the fluid reservoir of the first manifold. In an embodiment, the stator PCB may include electrical circuitry that operatively couples the stator to an electrical source such as a battery or A/C source to provide for rotating current or voltage around the stator to rotate the rotator. In an embodiment, the stator PCB may be operatively coupled to the PMU of the information handling system such that the PMU may operate as the electrical source to the stator. In an embodiment, the PMU may be operatively coupled to a hardware processing device (e.g., CPU, GPU, EC) of the information handling system that controls the activation and deactivation of the stator. In an embodiment, the activation and deactivation if the stator may be controlled by the hardware processing device based on detected temperature values obtained via a temperature sensor at, for example, the heat-producing component as determined by a thermal control system of the information handling system.

In an embodiment, a stator PCB and stator mount may be formed within the motor cover. The stator PCB and stator mount may be used to hold the stator PCB and stator in place within the motor cover.

At block 950, the method 900 also includes operatively coupling a distal cover to the second manifold, the distal cover including a plurality of distal bearings and a distal sealing ring. As describe herein, each of the distal bearings may receive a screw pump distal shaft therein to allow the integrated screw pumps to rotate freely. In an embodiment, each distal bearing may be placed within a distal bearing via formed into the distal cover. In an embodiment, the distal bearings may be fitted into the distal bearing vias using an engineering fit so that the distal bearing cannot be removed from within the distal bearing vias.

The distal cover further includes a distal sealing ring channel that receives the distal sealing ring. In an embodiment, the size of the distal sealing ring and distal sealing ring channel may be selected such that as the distal cover is fastened to the second manifold, the distal sealing ring is pressed between the distal cover and the second manifold. This fluidically seals the second manifold thereby preventing coolant from leaking out of the second manifold.

The method 900 further includes operatively coupling a fan module to a side of the liquid cooling module. In an embodiment, a fan module may be placed next to the set of stacked fins and operatively coupled to the liquid cooling module such that the fan module can create an airflow over and/or through the set of stacked fins. The side of the liquid cooling module opposite the fan module may be placed up against the vent formed into the housing of the information handling system such that heated air may pass out of the housing of the information handling system.

At block 960, the method 900 may continue with operatively coupling the liquid cooling module to the cold plate via a coolant inlet port and coolant outlet port formed in the first manifold and second manifold, respectively. In an embodiment, the coolant inlet port may be operatively coupled to a coolant discharge port at the cold plate via a hose. In an embodiment, the coolant outlet port may be operatively coupled to a coolant intake port at the cold plate. This coupling of the liquid cooling module to the cold plate forms a fluidic loop such that coolant may pass to and from the liquid cooling module and cold plate as described herein.

At block 965, a coolant fluid may be introduced into the fluidic loop created between the liquid cooling module and the cold plate. Again, the coolant may be any type of coolant such as water, deionized water, inhibited glycol and water solutions, and dielectric fluids, among other thermally conductive fluids. The housing of the information handling system may then be enclosed at block 970. At this point, the method 700 may end.

The blocks of the flow diagrams of FIG. 9 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps, or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An information handling system, comprising:
a hardware processor;
a memory device;
a power management unit (PMU) to provide power to the hardware processor and memory device; and
a liquid cooling module thermally coupled to a heat-producing component of the information handling system, the liquid cooling module including:
a plurality of coolant loop tube cores formed between a first manifold and a second manifold;
a plurality of integrated screw pumps formed through each of the coolant loop tube cores to draw coolant through the plurality of coolant loop tube cores;
the first manifold including a screw pump drive system to drive each of the integrated screw pumps;
the second manifold, wherein the first manifold, cylindrical cooling loop core, and second manifold hold the coolant therein for the screw pump to pump the coolant through the coolant loop tube core from the first manifold and to the second manifold; and
a fan module oriented between the first manifold and the second manifold to draw air transversely across a length of the plurality of coolant loop tube cores and in between the first manifold and the second manifold of the liquid cooling module.

2. The information handling system of claim 1, wherein the liquid cooling module further includes a heat exchanger comprising stacked fin layers wherein the plurality of cylindrical coolant loops are formed through vias through the stacked fin layers.

3. The information handling system of claim 1 further comprising:
the fan module including at least one fan oriented to rotate perpendicular to the plurality of coolant loop cores and placed under the liquid cooing module to pass air across the plurality of coolant loop tube cores.

4. The information handling system of claim 1 further comprising:
the plurality of coolant tube cores formed in the liquid cooling module; and
the plurality of integrated screw pumps each formed through one of the plurality of coolant loop tube cores driven by the screw pump drive system formed within a cavity of the first manifold to rotate the plurality of integrated screw pumps within each of the plurality of coolant loop tube cores.

5. The information handling system of claim 4 further comprising:
a transmission system of the screw pump drive system to concurrently drive each of the plurality of integrated screw pumps formed through each one of the plurality of coolant loop tube cores.

6. The information handling system of claim 1 further comprising:
the second manifold comprising a bearing to secure a distal end of each of the plurality of integrated screw pumps within the second manifold.

7. The information handling system of claim 1 further comprising:
the plurality of coolant loop tube cores; and
the plurality of integrated screw pumps each formed through one of the plurality of coolant loop tube cores, wherein the screw pump drive system includes:
a rotator operatively coupled to a stator; and
a plurality of wheels operatively coupled to each of the plurality of integrated screw pumps, wherein the rotator is operatively coupled to each wheel via a belt to drive each integrated screw pump to concurrently drive each of the plurality of integrated screw pumps.

8. The information handling system of claim 7, wherein the coolant loop tube core may be cylindrical, square, or rectangular.

9. A liquid cooling module for cooling a heat-producing component of an information handling system comprising:
a plurality of coolant loop tube cores formed between a first manifold and a second manifold;
a plurality of integrated screw pumps formed through each of the plurality of coolant loop tube cores to draw coolant from the first manifold to the second manifold;
the first manifold including a screw pump drive system to drive the plurality of integrated screw pumps;
the second manifold, wherein the first manifold, cylindrical cooling loop core, and second manifold hold the coolant therein for the screw pump to pump the coolant from the first manifold and to the second manifold through the plurality of cooling loop tube cores; and
a fan module oriented between the first manifold and the second manifold to draw air perpendicularly across a length of the plurality of coolant loop tube cores and in between the first manifold and the second manifold of the liquid cooling module.

10. The liquid cooling module of claim 9 further comprising:
a heat exchanger comprising stacked fin layers wherein the plurality of cylindrical coolant loops are formed through vias in the stacked fin layers.

11. The liquid cooling module of claim 9 further comprising:
the fan module including a plurality of fans placed under the liquid cooing module to pass air perpendicularly across the lengths of the plurality of coolant loop tube cores in between the first manifold and the second manifold.

12. The liquid cooling module of claim 9 further comprising:
the plurality of coolant loop tube cores; and
the plurality of integrated screw pumps each formed through one of the plurality of coolant loop tube cores, wherein the screw pump drive system is formed within a cavity of the first manifold to rotate the plurality of integrated screw pumps within each of the plurality of coolant loop tube cores.

13. The liquid cooling module of claim 12 further comprising:
a transmission system of the screw pump drive system to concurrently drive each of the plurality of integrated screw pumps formed through one of the plurality of coolant loop tube cores.

14. The liquid cooling module of claim 9 further comprising:
the plurality of coolant loop tube cores; and
the plurality of integrated screw pumps each formed through one of the plurality of coolant loop tube cores, wherein the screw pump drive system includes:
a rotator operatively coupled to a stator; and
a plurality of wheels operatively coupled to each of the plurality of integrated screw pumps, wherein the rotator is operatively coupled to each wheel via a belt to drive each integrated screw pump to concurrently drive each integrated screw pump.

15. The liquid cooling module of claim 14 further, wherein each of the plurality of wheels are formed within the first manifold.

16. A liquid cooling module of an information handling system operatively couplable to a heat-producing component within the information handling system, comprising:

a plurality of coolant loop tube cores formed through vias formed in a heat exchanger;

a plurality of integrated screw pumps, each integrated screw pump placed through one of the plurality of coolant loop tube cores;

a first manifold formed at a proximal end of each of the plurality of coolant loop tube cores, the first manifold including a screw pump drive system to drive each of the plurality of integrated screw pumps;

a second manifold formed at a distal end of each of the plurality of coolant loop tube cores, wherein the first manifold, plurality of cylindrical cooling loop cores, and second manifold hold a coolant therein for the plurality of screw pumps to pump the coolant from a coolant input port formed in the first manifold, through the coolant loop tube cores, and to a coolant outlet port formed in the second manifold;

a fan module oriented between the first manifold and the second manifold to draw air transversely across a length of the plurality of coolant loop tube cores and in between the first manifold and the second manifold of the liquid cooling module.

17. The information handling system of claim 16 further comprising:

the fan module including at least one fan with fan rotation perpendicular to the length of the plurality of coolant loop tube cores and placed under the liquid cooing module to pass air transversely across the lengths of the plurality of coolant loop tube cores in between the first manifold and the second manifold.

18. The information handling system of claim 16 further comprising:

a transmission system of the screw pump drive system to concurrently drive each of the plurality of integrated screw pumps formed through one of the plurality of coolant loop tube cores.

19. The information handling system of claim 16 further comprising:

the second manifold comprising a bearing to secure a distal end of the integrated screw pump within the second manifold.

20. The information handling system of claim 16, wherein the screw pump drive system includes a rotator operatively coupled to a stator, and a plurality of wheels operatively coupled to each of the plurality of integrated screw pumps, wherein the rotator is operatively coupled to each wheel via a belt to drive each integrated screw pump to concurrently drive each of the plurality of integrated screw pumps.

* * * * *